US012641785B2

(12) United States Patent
Yang et al.

(10) Patent No.: US 12,641,785 B2
(45) Date of Patent: May 26, 2026

(54) FIELD EFFECT TRANSISTOR WITH TOP-PROTECTED GATE ELECTRODE AND METHODS FOR FORMING THE SAME

(71) Applicant: Taiwan Semiconductor Manufacturing Company Limited, Hsinchu (TW)

(72) Inventors: Yu-Hsiang Yang, Tainan (TW); Chen-Ming Huang, Tainan (TW); Po-Wei Liu, Tainan (TW); Shih-Hsien Chen, Zhubei (TW); Hung-Ling Shih, Tainan (TW); Chang Hung-Chang, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 443 days.

(21) Appl. No.: 18/314,166

(22) Filed: May 9, 2023

(65) Prior Publication Data

US 2024/0381637 A1    Nov. 14, 2024

(51) Int. Cl.
H10B 41/60 (2023.01)
H01L 21/768 (2006.01)
H10D 30/68 (2025.01)
H10D 30/69 (2025.01)

(52) U.S. Cl.
CPC ....... H10B 41/60 (2023.02); H01L 21/76843 (2013.01); H10D 30/6891 (2025.01); H10D 30/711 (2025.01)

(58) Field of Classification Search
CPC ... H10B 41/60; H10B 41/47; H01L 21/76843; H10D 30/6891; H10D 30/711; H10D 84/0147; H10D 84/0144; H10D 84/8314; H10D 84/8316
See application file for complete search history.

(56) References Cited

U.S. PATENT DOCUMENTS 7,709,317 B2 *   5/2010   Yang .................... H10D 30/792
                                                         438/153
2021/0376111 A1 *  12/2021  Chuang ................ H10D 84/038

* cited by examiner

*Primary Examiner* — David Vu
(74) *Attorney, Agent, or Firm* — The Marbury Law Group, PLLC

(57) ABSTRACT

A field effect transistor includes a source region and a drain region embedded in a portion of a semiconductor substrate; a gate dielectric overlying a channel region located between the source region and the drain region; a gate electrode overlying the gate dielectric; a dielectric gate liner laterally surrounding the gate electrode; a inner gate spacer laterally surrounding the dielectric gate liner; a contoured gate capping dielectric including a vertically-extending portion that laterally surrounds the inner gate spacer and a horizontally-extending portion that overlies the gate electrode; and a outer gate spacer laterally surrounding the contoured gate capping dielectric.

20 Claims, 15 Drawing Sheets

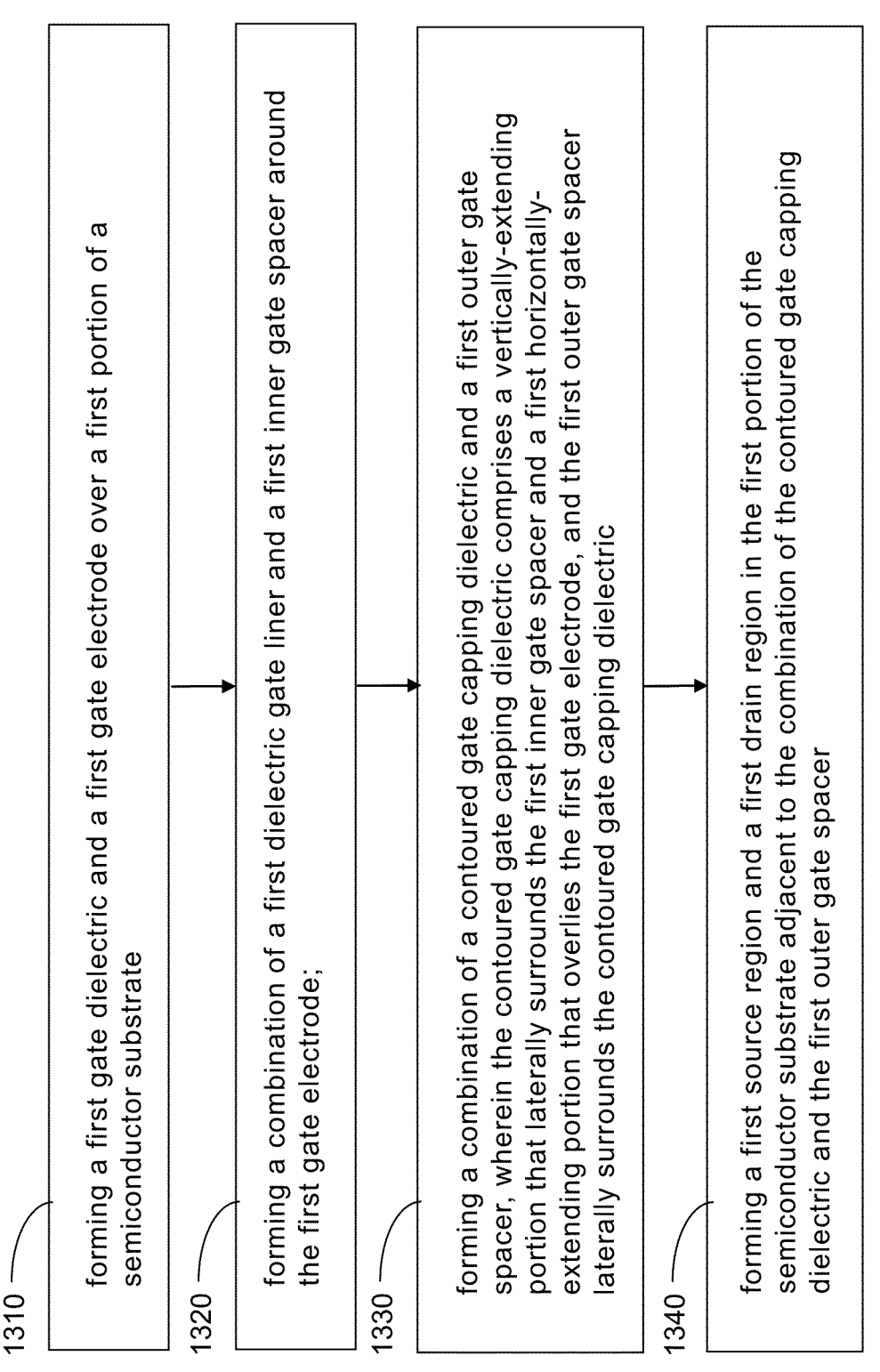

1310 — forming a first gate dielectric and a first gate electrode over a first portion of a semiconductor substrate 1320 — forming a combination of a first dielectric gate liner and a first inner gate spacer around the first gate electrode;

1330 — forming a combination of a contoured gate capping dielectric and a first outer gate spacer, wherein the contoured gate capping dielectric comprises a vertically-extending portion that laterally surrounds the first inner gate spacer and a first horizontally-extending portion that overlies the first gate electrode, and the first outer gate spacer laterally surrounds the contoured gate capping dielectric 1340 — forming a first source region and a first drain region in the first portion of the semiconductor substrate adjacent to the combination of the contoured gate capping dielectric and the first outer gate spacer

FIG. 13

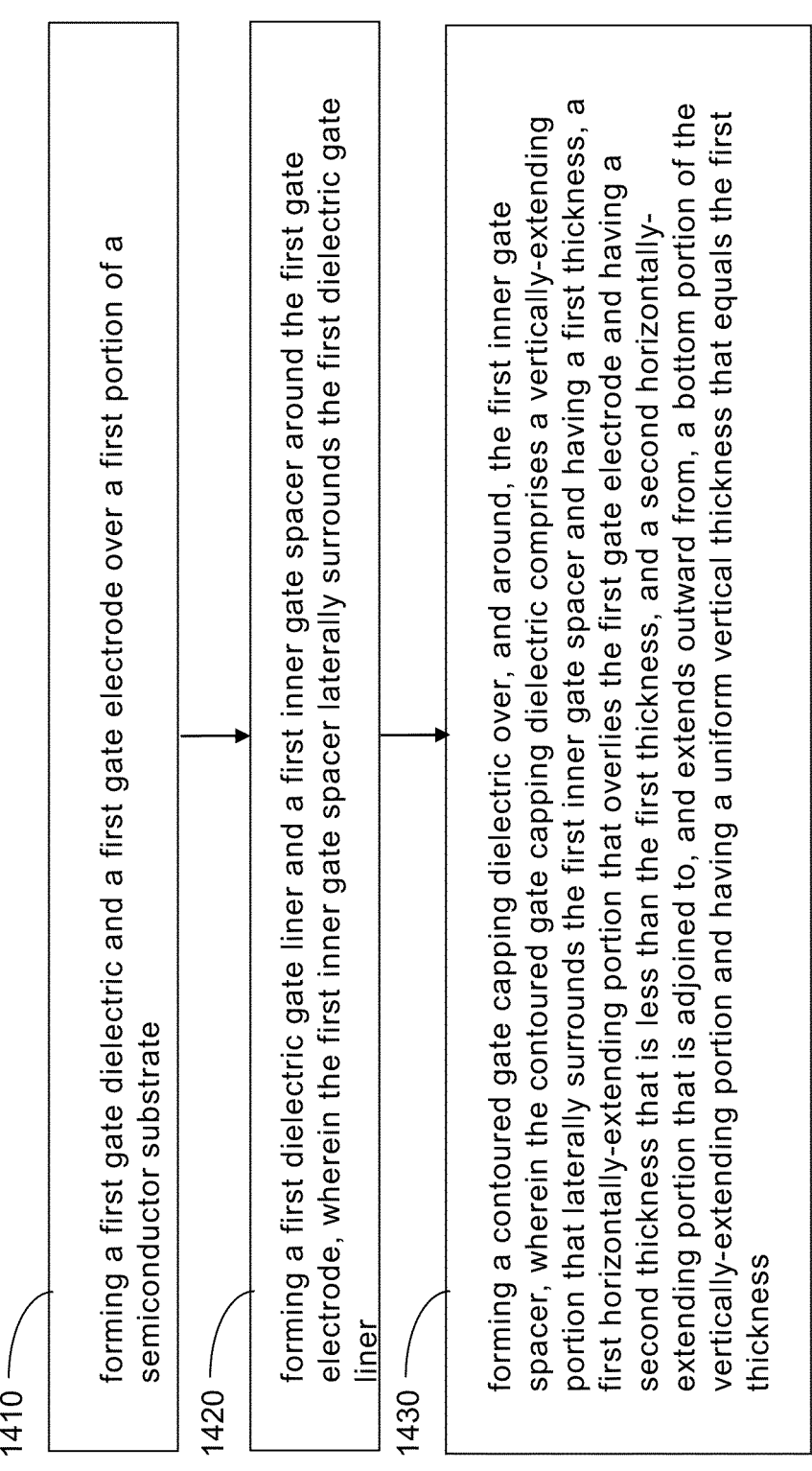

1410 forming a first gate dielectric and a first gate electrode over a first portion of a semiconductor substrate 1420 forming a first dielectric gate liner and a first inner gate spacer around the first gate electrode, wherein the first inner gate spacer laterally surrounds the first dielectric gate liner 1430 forming a contoured gate capping dielectric over, and around, the first inner gate spacer, wherein the contoured gate capping dielectric comprises a vertically-extending portion that laterally surrounds the first inner gate spacer and having a first thickness, a first horizontally-extending portion that overlies the first gate electrode and having a second thickness that is less than the first thickness, and a second horizontally-extending portion that is adjoined to, and extends outward from, a bottom portion of the vertically-extending portion and having a uniform vertical thickness that equals the first thickness

FIG. 14

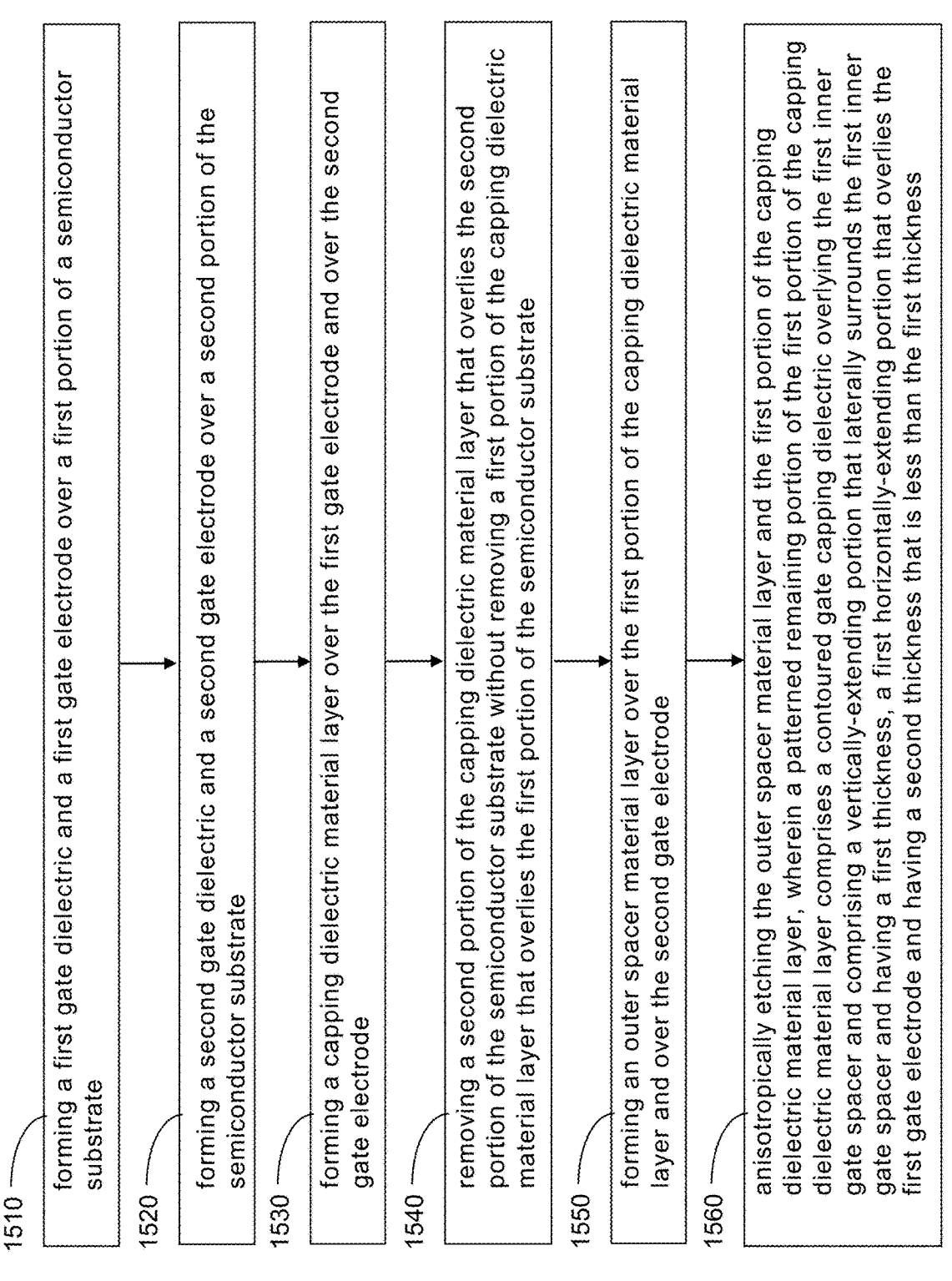

1510 — forming a first gate dielectric and a first gate electrode over a first portion of a semiconductor substrate 1520 — forming a second gate dielectric and a second gate electrode over a second portion of the semiconductor substrate 1530 — forming a capping dielectric material layer over the first gate electrode and over the second gate electrode 1540 — removing a second portion of the capping dielectric material layer that overlies the second portion of the semiconductor substrate without removing a first portion of the capping dielectric material layer that overlies the first portion of the semiconductor substrate 1550 — forming an outer spacer material layer over the first portion of the capping dielectric material layer and over the second gate electrode 1560 — anisotropically etching the outer spacer material layer and the first portion of the capping dielectric material layer, wherein a patterned remaining portion of the first portion of the capping dielectric material layer comprises a contoured gate capping dielectric overlying the first inner gate spacer and comprising a vertically-extending portion that laterally surrounds the first inner gate spacer and having a first thickness, a first horizontally-extending portion that overlies the first gate electrode and having a second thickness that is less than the first thickness

FIG. 15

FIELD EFFECT TRANSISTOR WITH TOP-PROTECTED GATE ELECTRODE AND METHODS FOR FORMING THE SAME

BACKGROUND

Retention fails in multi-time-programmable (MTP) devices may occur due to a thinning of a dielectric layer in a corner region around a gate electrode. Retention fails can adversely impact device performance and reliability of the MTP devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 is a first flow chart illustrating a general sequence of processing steps that can be used to form a semiconductor device of the present disclosure.

FIG. 14 is a second flow chart illustrating a general sequence of processing steps that can be used to form a semiconductor device of the present disclosure.

FIG. 15 is a third flow chart illustrating a general sequence of processing steps that can be used to form a semiconductor device of the present disclosure.

DETAILED DESCRIPTION

Figure 1:
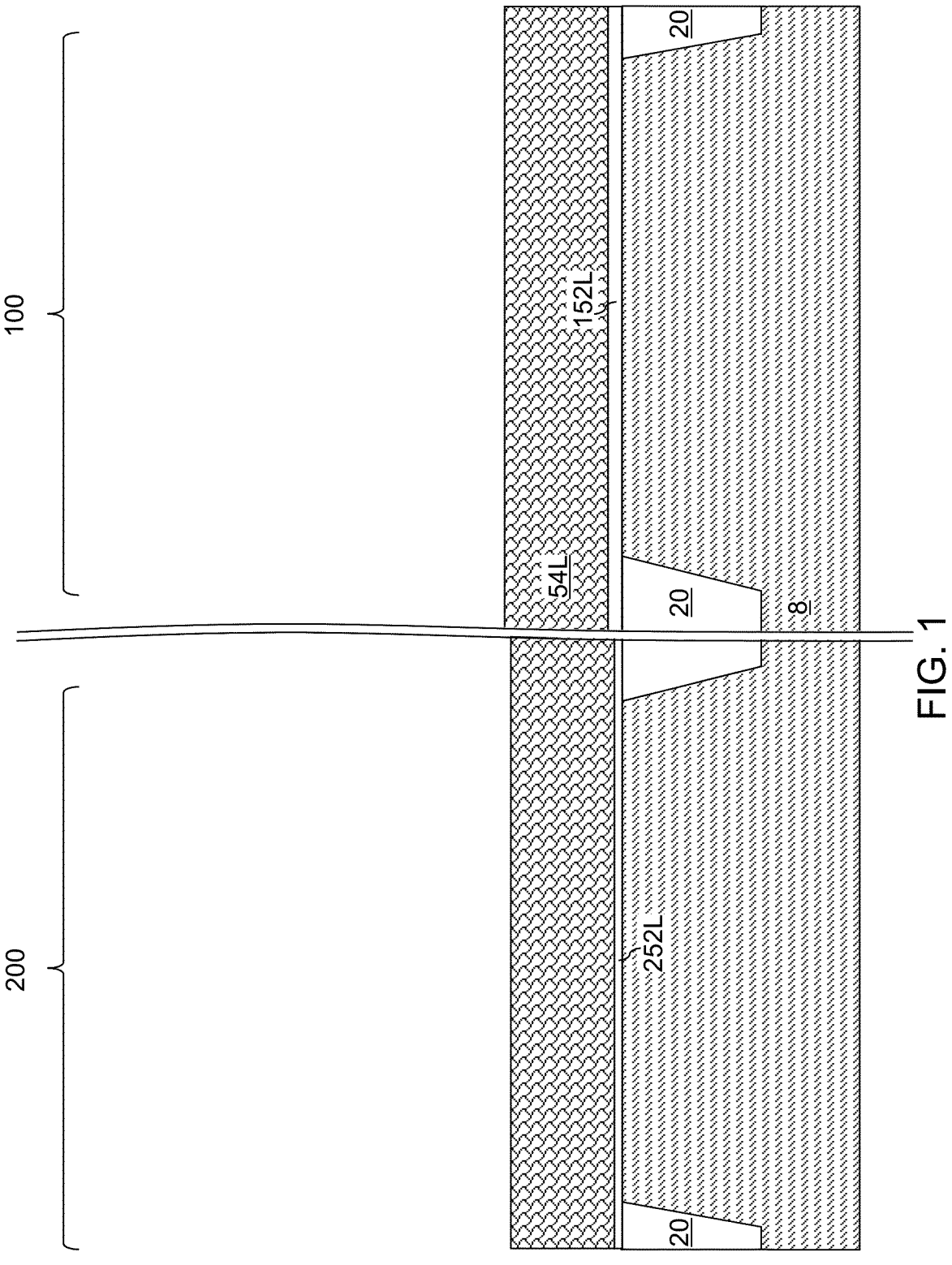
FIG. 1 is a vertical cross-sectional view of an exemplary structure after formation of shallow trench isolation structures, gate dielectric layers, and a gate electrode material layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise. Embodiments of the present disclosure are directed to a field effect transistor including a downward-protruding gate electrode and methods for forming the same, the various aspects of which are now described in detail.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. An "active region" refers to a source region of a field effect transistor or a drain region of a field effect transistor. A "source extension region" refers to a doped semiconductor region having a lesser dopant concentration than, and having a same type of doping as, a source region and including a portion disposed between the source region and the channel region. A "drain extension region" refers to a doped semiconductor region having a lesser dopant concentration than, and having a same type of doping as, a drain region and including a portion disposed between the drain region and the channel region. An "active region extension" refers to a source extension region or a drain extension region.

Embodiments of the present disclosure are directed to a semiconductor structure, and particularly to a multiple-time-programmable (MTP) memory device including a field effect transistor having a floating gate, in which retention characteristics for the gate electrode is improved through use of a contoured gate capping dielectric that protects the gate electrode during processing steps that follow spacer formation processes. Specifically, in some embodiments, the top corner portions of the gate electrode may be covered by a horizontally-extending portion of the contoured gate capping dielectric, and thus, enhances multiple-time-programming retention characteristics for the MTP memory device without modifying structures for logic-side field effect transistors.

Referring to FIG. 1, an exemplary structure for forming an MTP device according to an embodiment of the present disclosure is illustrated. The exemplary structure may include a semiconductor substrate 8 including a semiconductor material at least at a top portion thereof. In one embodiment, the semiconductor substrate 8 may comprise a commercially available semiconductor substrate such as a single crystalline silicon substrate. The illustrated portion of the exemplary structure comprises a first device region 100 in which a memory device is to be subsequently formed, and a second device region 200 in which a logic device is to be subsequently formed. The first device region 100 may comprise a first portion of the semiconductor substrate 8, and the second device region 200 may comprise a second portion of the semiconductor substrate 8. Each portion of the semiconductor substrate 8 may be doped with electrical dopants at a suitable atomic concentration. For example, the first portion and the second portion of the semiconductor substrate 8 may be doped with dopants of a first conductivity type (which may be p-type or n-type), and the atomic concentration of the dopants of the first conductivity type in the first portion and the second portion of the semiconductor substrate 8 may be independently in a range from $1.0 \times 10^{13}/cm^3$ to $3.0 \times 10^{17}/cm^3$, such as from $1.0 \times 10^{14}/cm^3$ to $3.0 \times 10^{16}/cm^3$, although lesser and greater atomic concentrations may also be used.

While the present disclosure is described using an embodiment in which the first portion and the second portion of the semiconductor substrate 8 are doped with dopants of a same conductivity type, which is hereafter referred to as a first conductivity type, and in which a first field effect transistor to be formed in the first device region 100 and a second field effect transistor to be formed in the second device region 200 share the same ion implantation processes for forming source/drain extension regions, compensation implantation regions, and source/drain regions, it should be understood that multiple ion implantation processes may be used in lieu of a single ion implantation process for formation of any of the source/drain extension regions, the compensation implantation regions, and the source/drain regions.

Shallow trenches may be formed in an upper portion of the semiconductor substrate 8. For example, a hard mask layer (not shown) can be formed over the over the top surface of the semiconductor substrate 8, and can be patterned to form interconnected openings that laterally surrounds a respective device area. An anisotropic etch process can be performed to etch unmasked upper portions of the semiconductor substrate 8 that are not masked by the hard mask layer. The volumes of voids from which the material of the semiconductor substrate 8 are etched constitute the shallow trenches. The depth of the shallow trenches may be in a range from 100 nm to 400 nm, such as from 150 nm to 300 nm, although lesser and greater depths may also be used.

A dielectric fill material such as silicon oxide may be deposited in the shallow trenches by a conformal deposition process such as a chemical vapor deposition process. Excess portions of the dielectric fill material can be removed from above the horizontal plane including the top surface of the first hard mask layer by performing a planarization process, which may include a chemical mechanical polishing process and/or a recess etch process. Remaining portions of the dielectric fill material may be subsequently recessed, for example, by performing a wet etch process that recesses top surfaces of the remaining portions of the dielectric material approximately down to the horizontal plane including the topmost surface of the semiconductor substrate 8. Shallow trench isolation structures 20 can be formed in the shallow trenches.

The shallow trench isolation structures 20 include remaining portions of the dielectric fill material, which may include silicon oxide. The top surface of the shallow trench isolation structures 20 can be located above, below, or at the horizontal plane including the topmost surface of the semiconductor substrate 8. The hard mask layer can be subsequently removed selective to the materials of the semiconductor substrate 8 and the shallow trench isolation structures 20, for example, using a wet etch process. For example, in embodiments in which the hard mask layer comprises silicon nitride, a wet etch process using hot phosphoric acid may be used to remove the hard mask layer.

A first gate dielectric layer 152L having a first gate dielectric thickness can be formed in the first device region 100, and a second gate dielectric layer 252 having a second gate dielectric thickness can be formed in the second device region 200. In one embodiment, the thickness and the material composition of the first gate dielectric layer 152L may be optimized for a multiple-time-programmable memory device to be subsequently formed in the first device region 100, and the thickness of the material composition of the second gate dielectric layer 252L may be optimized for a logic device to be subsequently formed in the second device region 200. For example, the first gate dielectric layer 152L may be optimized for charge tunneling and retention under voltage bias conditions during operation of the multiple-time-programmable memory device to be subsequently formed, and the second gate dielectric layer 252L may be optimized for performance of the logic function of the logic device to be subsequently formed.

A gate electrode material layer 54L can be subsequently formed over the first gate dielectric layer 152L and the second gate dielectric layer 252L. The gate electrode material layer 54L may include a conductive material such as heavily-doped polysilicon and/or at least one metallic material (such as a combination of a metallic barrier liner including a conductive metallic nitride material and a metallic fill material such as W, Ta, Ti, Co, Ru, Mo, etc.). The thickness of the gate electrode material layer 54L may be in a range from 100 nm to 300 nm, such as from 150 nm to 250 nm, although lesser and greater thicknesses may also be used.

Figure 2:
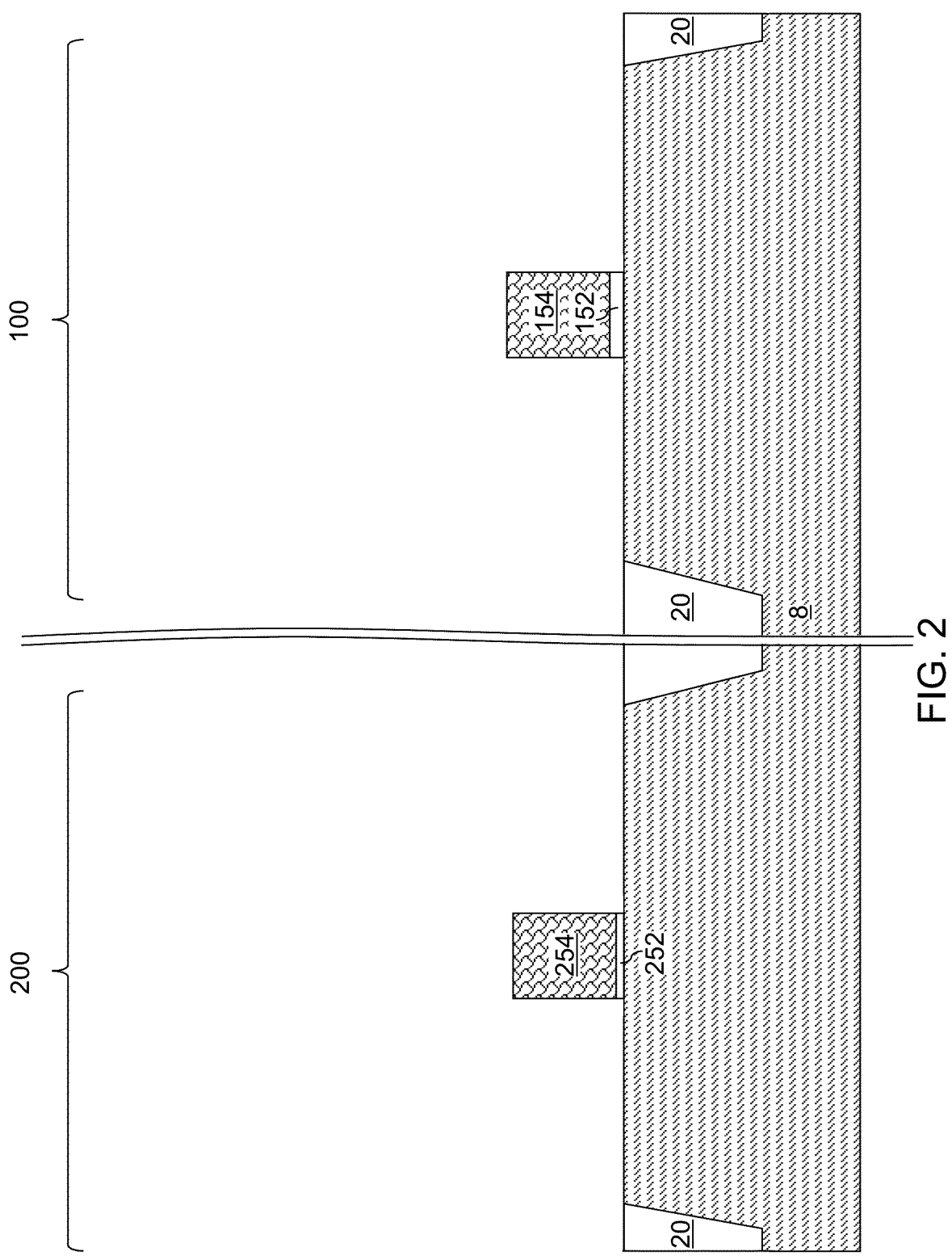
FIG. 2 is a vertical cross-sectional view of the exemplary structure after formation of gate dielectrics and gate electrodes according to an embodiment of the present disclosure.

Referring to FIG. 2, a photoresist layer (not shown) can be applied over the gate electrode material layer 54L, and can be lithographically patterned to form patterned photoresist material portions. An anisotropic etch process can be performed to transfer the pattern in the patterned photoresist layer through the gate electrode material layer 54L and the gate dielectric layers (152L, 252L). A patterned portion of the first gate dielectric layer 152L comprises a first gate dielectric 152. A patterned portion of the second gate dielectric layer 252L comprises a second gate dielectric 252. Patterned portions of the gate electrode material layer 54L comprises a first gate electrode 154 overlying the first gate dielectric 152, and a second gate electrode 254 overlying the second gate dielectric 252. Generally, a stack of a first gate dielectric 152 and a first gate electrode 154 can be formed over a first portion of a semiconductor substrate 8 in the first device region, and a stack of a second gate dielectric 252 and a second gate electrode 254 can be formed over a second portion of the semiconductor substrate 8 in the second device region 200.

The first gate electrode 154 can be used as a floating gate electrode for the multiple-time-programmable memory device to be subsequently formed. Thus, the first gate electrode 154 comprises a portion that functions as a gate electrode of a first field effect transistor to be subsequently formed in the first device region 100. Further, the first gate electrode 154 may comprise at least one extension portion (not shown) that extends over a shallow trench isolation structure and over another device region in which a programming device or an erase device configured to inject or extract electrical charges into the first gate electrode 154.

Generally speaking, any type of a programming device or an erase device known in the art may be used. In an illustrative example, a programming device may comprise a first capacitor structure in which a first extension portion of the first gate electrode 154 functions as a first electrode, a conductive structure such as a doped semiconductor portion of the semiconductor substrate 8 that is laterally surrounded by a shallow trench isolation structure 20 as a second electrode, and a patterned portion (not shown) of the first gate dielectric layer 252L as a tunneling dielectric. Likewise, an erase device may comprise a second capacitor structure in which a second extension portion of the first gate electrode 154 functions as a first electrode, an additional conductive structure such as a doped semiconductor portion of the semiconductor substrate 8 that is laterally surrounded by a shallow trench isolation structure 20 as a second electrode, and an additional patterned portion (not shown) of the first gate dielectric layer 252L as an additional tunneling dielectric. The first gate electrode 154 is not electrically shorted (electrically connected) or contacted by any other conductive structure in a final device, and thus, is electrically floating.

Figure 3:
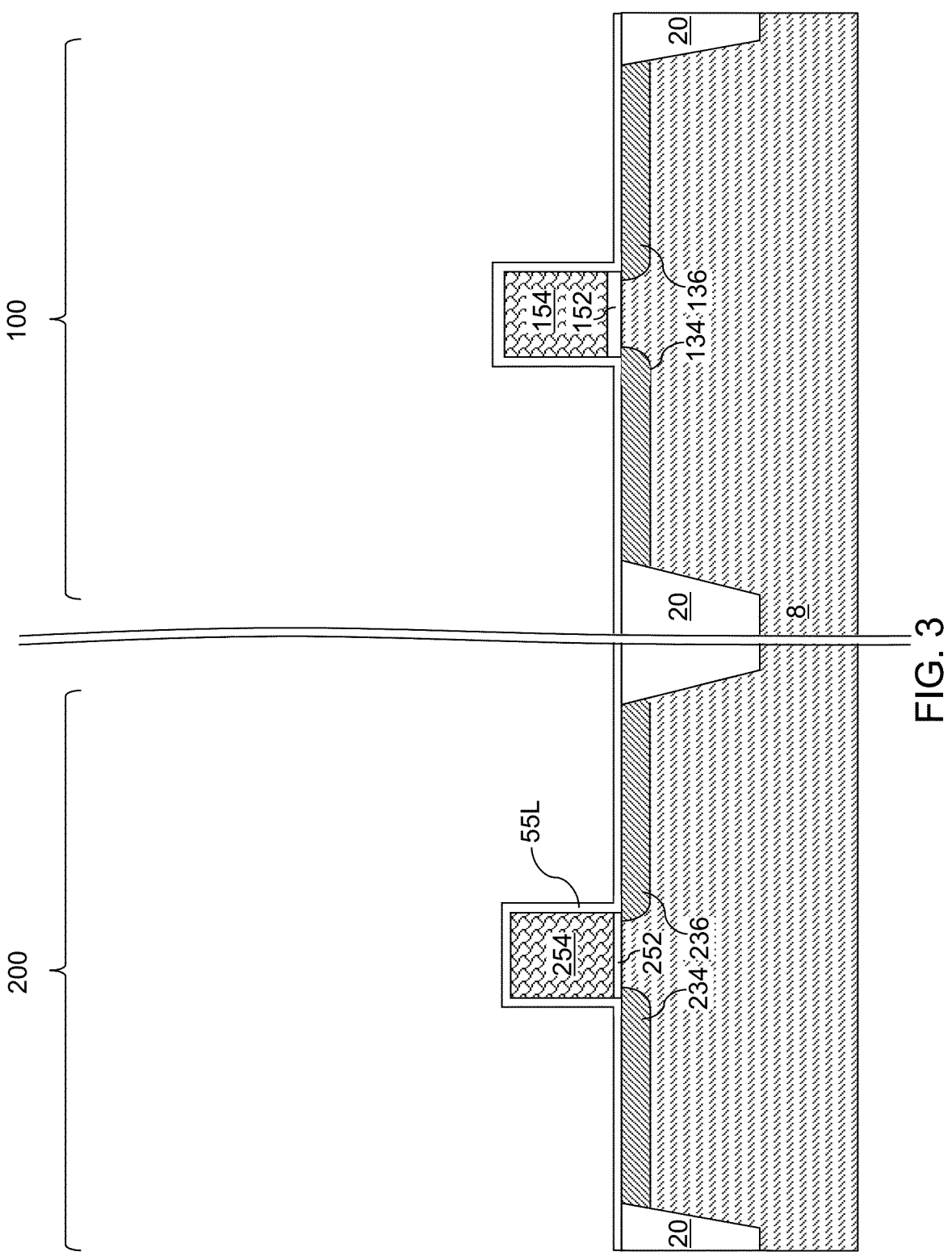
FIG. 3 is a vertical cross-sectional view of an exemplary structure after formation of a dielectric liner material layer and source/drain extension regions according to an embodiment of the present disclosure.

Referring to FIG. 3, a dielectric liner material layer 55L can be deposited over the first gate electrode 154, the second gate electrode 254, and the top surface of the semiconductor substrate 8 by a conformal deposition process. The dielectric liner material layer 55L may comprise, and/or may consist essentially of, a first silicon oxide material. In one embodiment, the dielectric liner material layer 55L may comprise a silicon oxide material formed by thermal decomposition of tetraethylorthosilicate (TEOS) in a low pressure chemical vapor deposition (LPCVD) process. The low pressure chemical vapor deposition process may be performed in a furnace at a pressure in a range from 20 m Torr to 200 mTorr and in a temperature range from 550 degrees Celsius to 700 degrees Celsius, although lesser and greater pressures and/or lower or higher temperatures may also be used. As a conformal material layer, the thickness of the dielectric liner material layer 55L may be uniform throughout, and may be in a range from 2 nm to 8 nm, such as from 3 nm to 6 nm, although lesser and greater thicknesses may also be used.

A first ion implantation process can be performed to implant dopants of a second conductivity type in upper portions of the semiconductor substrate 8 that are not masked by the gate electrodes (154, 254) or vertically-extending portions of the dielectric liner material layer 55L. The second conductivity type is the opposite of the first conductivity type, which is the conductivity type of the doping in the first portion and the second portion of the semiconductor substrate 8 in the first device region 100 and in the second device region 200. For example, if the first conductivity type is p-type, the second conductivity type is n-type, and vice versa.

Various source/drain extension regions (134, 136, 234, 236) can be formed in the semiconductor substrate 8 by conversion of surface portions of the semiconductor substrate 8 into doped semiconductor material portions having a net doping of the second conductivity type. The various source/drain extension regions (134, 136, 234, 236) comprise a first source extension region 134 and a first drain extension region 136 that are formed in the first device region 100, and a second source extension region 234 and a second drain extension region 236 that are formed in the second device region 200. The various source/drain extension regions (134, 136, 234, 236) can be formed by performing the first ion implantation process, which uses vertically-extending portions of the dielectric liner material layer 55L, the first electrode 154, and the second electrode 254 as components of a first ion implantation mask.

The net dopant concentration (i.e., the atomic concentration of dopants of the second conductivity type less the atomic concentration of dopants of the first conductivity type) in the source/drain extension regions (134, 136, 234, 236) may be in a range from $3.0 \times 10^{18}/cm^3$ to $1.0 \times 10^{20}/cm^3$, such as from $5.0 \times 10^{18}/cm^3$ to $5.0 \times 10^{19}/cm^3$, although lesser and greater net dopant concentrations may also be used. The thickness of the source/drain extension regions (134, 136, 234, 236) (i.e., the vertical distance between the top surface and the bottom surface of each of the source/drain extension regions (134, 136, 234, 236)) may be in a range from 10 nm to 100 nm, such as from 20 nm to 60 nm, although lesser and greater thicknesses may also be used. Generally, the thickness of the dielectric liner material layer 55L may be adjusted to optimize the lateral offset distance between each sidewall of the gate electrodes (154, 254) and a proximal edge of the top surface of a respective underlying one of the source/drain extension regions (134, 136, 234, 236). The lateral separation distance between a neighboring pair of a source extension region (134 or 234) and a drain extension region (136 or 236) is the physical channel length of a respective transistor to be subsequently formed.

Figure 4:
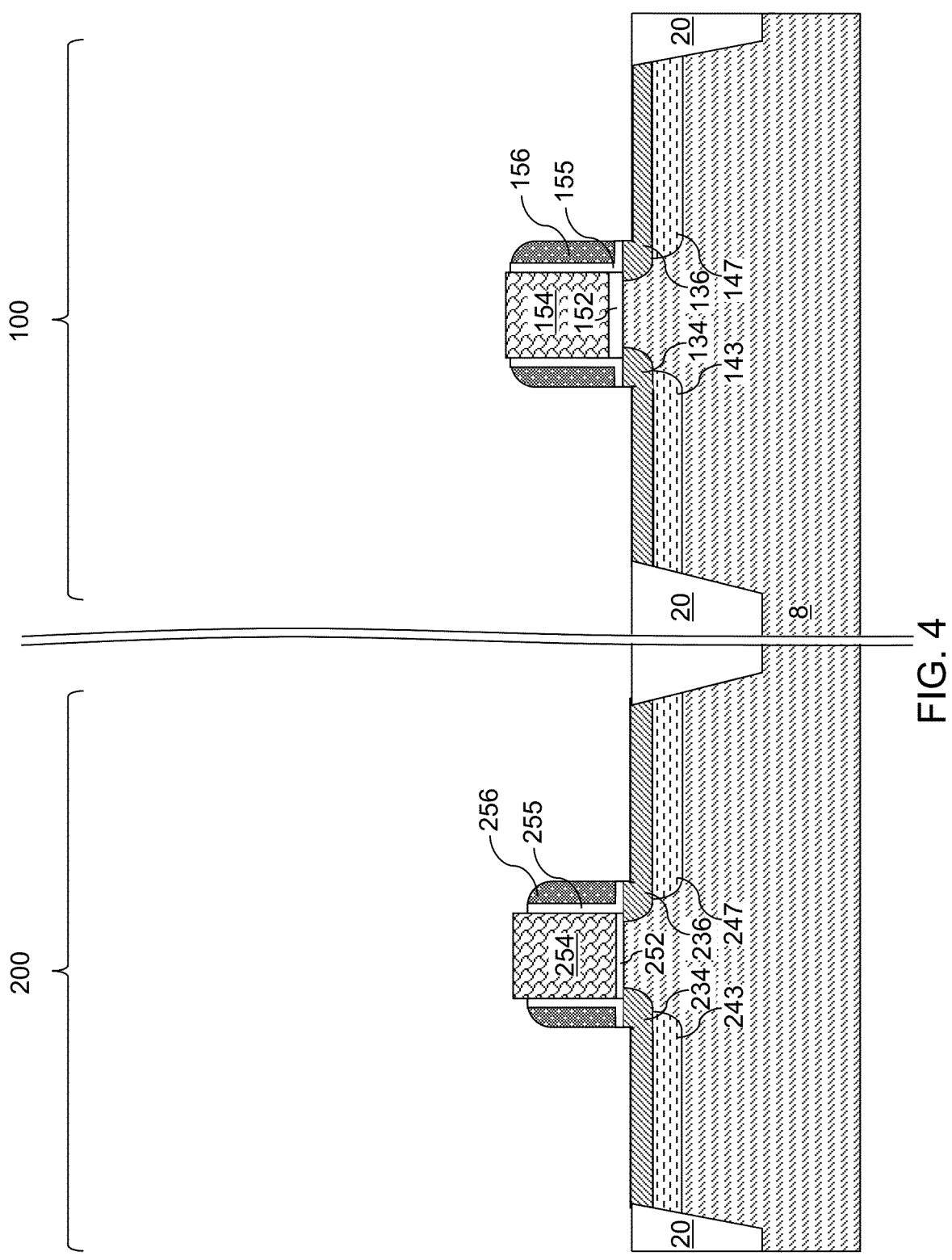
FIG. 4 is a vertical cross-sectional view of the exemplary structure after formation of dielectric gate liners, inner gate spacers, and compensation implantation regions according to an embodiment of the present disclosure.

Referring to FIG. 4, an inner spacer material layer comprising an inner spacer dielectric material can be conformally deposited over the dielectric liner material layer 55L. The inner spacer dielectric material may be different from the material of the dielectric liner material layer 55L. For example, the inner spacer dielectric material may comprise a first silicon nitride material. In one embodiment, the inner spacer material layer may be formed by a low pressure chemical vapor deposition process using dichlorosilane and ammonia as reactant gases. In this embodiment, the deposition pressure may be in a range from 50 mTorr to 200 mTorr, and the deposition temperature may be in a range from 700 degrees Celsius to 800 degrees Celsius. The thickness of the inner spacer material layer may be in a range from 5 nm to 20 nm, such as from 7 nm to 15 nm, although lesser and greater thicknesses may also be used.

A first anisotropic etch process can be performed to remove horizontally-extending portions of the inner spacer material layer and the dielectric liner material layer 55L. Each remaining vertically-extending portion of the inner spacer material layer constitutes an inner gate spacer (156, 256). The inner gate spacers (156, 256) may comprise a first inner gate spacer 156 that is formed in the first device region 100, and a second inner gate spacer 256 that is formed in the second device region 200. Each remaining portion of the dielectric liner material layer 55L constitutes a dielectric gate liner (155, 255). The dielectric gate liners (155, 255) may comprise a first dielectric gate liner 155 that is formed in the first device region 100, and a second dielectric gate liner 255 that is formed in the second device region 200.

A combination of a first dielectric gate liner 155 and a first inner gate spacer 156 can be formed around the first gate electrode 154, and a combination of a second dielectric gate liner 255 and a second inner gate spacer 256 can be formed around the second gate electrode 254. The first inner gate spacer 156 contacts, and laterally surrounds, the first dielectric gate liner 155, and the second inner gate spacer 256 contacts, and laterally surrounds, the second dielectric gate liner 255.

The first anisotropic etch process is generally selective to the semiconductor materials of the semiconductor substrate 8 and the gate electrodes (154, 254) (in embodiments in which the gate electrodes comprise a semiconductor material). However, collateral etching of the top portions of the various source/drain extension regions (134, 136, 234, 236) can vertically recess physically exposed portions of the top surface of the various source/drain extension regions (134, 136, 234, 236), and may form a stepped profile for the top surfaces of the various source/drain extension regions (134, 136, 234, 236). The step height of the vertically-extending surface segment of each of the stepped top surfaces of the various source/drain extension regions (134, 136, 234, 236) may be in a range from 0.1 nm to 5 nm, such as from 0.3 nm to 3 nm, and/or from 0.5 nm to 2 nm, although lesser and greater step heights may also be used.

The first gate dielectric 152 overlies a first channel region located between the first source extension region 134 and the first drain extension region 136. The first gate electrode 154 overlies the first gate dielectric 152. The first dielectric gate liner 155 laterally surrounds the first gate electrode 154. The first inner gate spacer 156 laterally surrounds the first dielectric gate liner 155. The second gate dielectric 252 overlies a second channel region located between the second source extension region 234 and the second drain extension region 236. The second gate electrode 254 overlies the second gate dielectric 252. The second dielectric gate liner 255 laterally surrounds the second gate electrode 254. The second inner gate spacer 256 laterally surrounds the second dielectric gate liner 255. The second dielectric gate liner 255 has the same thickness and the same material composition as the first dielectric gate liner 155. The second inner gate spacer 256 has the same thickness and the same material composition as the first inner gate spacer 156.

In one embodiment, the first source extension region 134 comprises a first topmost source extension surface segment that contacts a bottom surface of the first dielectric gate liner 155 and a first recessed source extension surface segment that underlies the horizontal plane including the bottom surface of the first gate dielectric 152. The first source extension region 134 comprises a first vertically-extending surface segment that connects the first topmost source extension surface segment and the first recessed source extension surface segment. The second source extension region 234 comprises a second topmost source extension surface segment that contacts a bottom surface of the second dielectric gate liner 255 and a second recessed source extension surface segment that underlies the horizontal plane including the bottom surface of the second gate dielectric 252. The second source extension region 234 comprises a second vertically-extending surface segment that connects the second topmost source extension surface segment and the second recessed source extension surface segment.

A second ion implantation process can be performed to implant dopants of the first conductivity type into portions of the semiconductor substrate 8 that are not masked by the gate electrodes (154, 254), the dielectric gate liners (155, 255), and the inner gate spacers (156, 256) and underlie the source/drain extension regions (134, 136, 234, 236). The gate electrodes (154, 254), the dielectric gate liners (155, 255), and the inner gate spacers (156, 256) are used as components of a second ion implantation mask during the second ion implantation process.

Various compensation implantation regions (143, 147, 243, 247), also referred to halo implantation regions, can be formed in the semiconductor substrate 8 by conversion of surface portions of the semiconductor substrate 8 into doped semiconductor material portions having a net doping of the first conductivity type. The various compensation implantation regions (143, 147, 243, 247) comprise a first source-side compensation implantation region 143, a first drain-side compensation implantation region 147, a second source-side compensation implantation region 243, and a second drain-side compensation implantation region 247.

The atomic concentration of dopants of the first conductivity type in the compensation implantation regions (143, 147, 243, 247) may be in a range from $1.0 \times 10^{16}/\text{cm}^3$ to $1.0 \times 10^{18}/\text{cm}^3$, such as from $3.0 \times 10^{17}/\text{cm}^3$ to $3.0 \times 10^{18}/\text{cm}^3$, although lesser and greater net dopant concentrations may also be used. The vertical thickness of the compensation implantation regions (143, 147, 243, 247) may be in a range from 10 nm to 200 nm, such as from 20 nm to 120 nm, although lesser and greater thicknesses may also be used.

Figure 5:
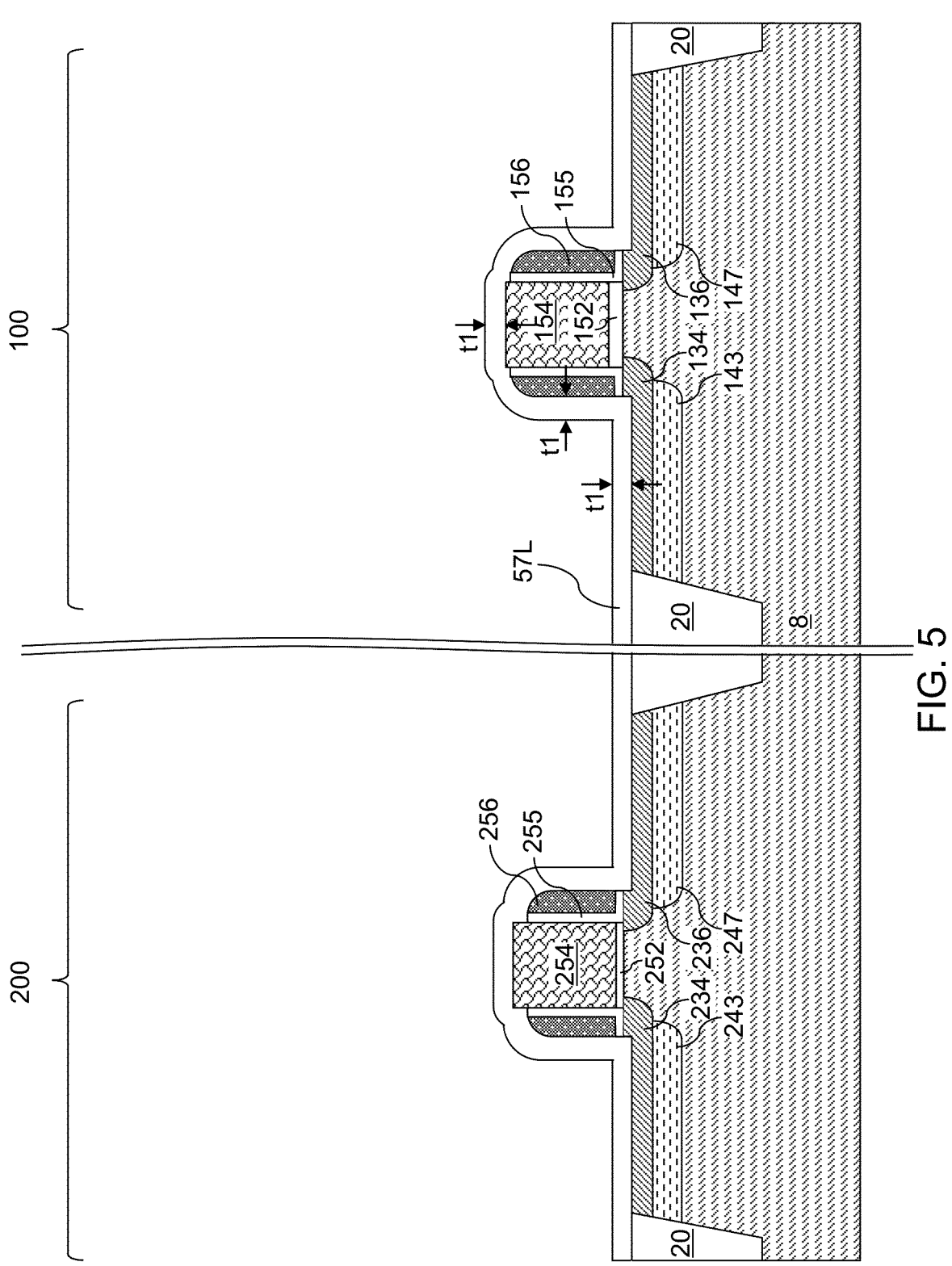
FIG. 5 is a vertical cross-sectional view of the exemplary structure after formation of a capping dielectric material layer according to an embodiment of the present disclosure.

Referring to FIG. 5, a capping dielectric material layer 57L can be formed over the combination of the first gate dielectric 152, the first gate electrode 154, the first dielectric gate liner 155, and the first inner gate spacer 156, over the combination of the second gate dielectric 252, the second gate electrode 254, the second dielectric gate liner 255, and the second inner gate spacer 256, and over the physically exposed surface of the various source/drain extension regions (134, 136, 234, 236) and the shallow trench isolation structures 20. A first portion of the capping dielectric material layer 57L can be formed over the first portion of the semiconductor substrate 8 in the first device region 100, and a second portion of the capping dielectric material layer 57L can be formed over the second portion of the semiconductor substrate 8 in the second device region 200.

In one embodiment, the capping dielectric material layer 57L comprises, and/or consists essentially of, a second silicon oxide material. In one embodiment, the capping dielectric material layer 57L comprises a silicon oxide material formed by thermal decomposition of tetraethyl-orthosilicate (TEOS) in a low pressure chemical vapor deposition process. The low pressure chemical vapor deposition process may be performed in a furnace at a pressure in a range from 20 m Torr to 200 mTorr and in a temperature range from 550 degrees Celsius to 700 degrees Celsius, although lesser and greater pressures and/or lower or higher temperatures may also be used. As a conformal material layer, the thickness of the capping dielectric material layer 57L may be uniform throughout, and may be in a range from 10 nm to 60 nm, such as from 15 nm to 50 nm, and/pr from 20 nm to 40 nm, although lesser and greater thicknesses may also be used. The uniform thickness of the capping dielectric material layer 57L at this processing step is herein referred to as a first thickness t1.

Figure 6:
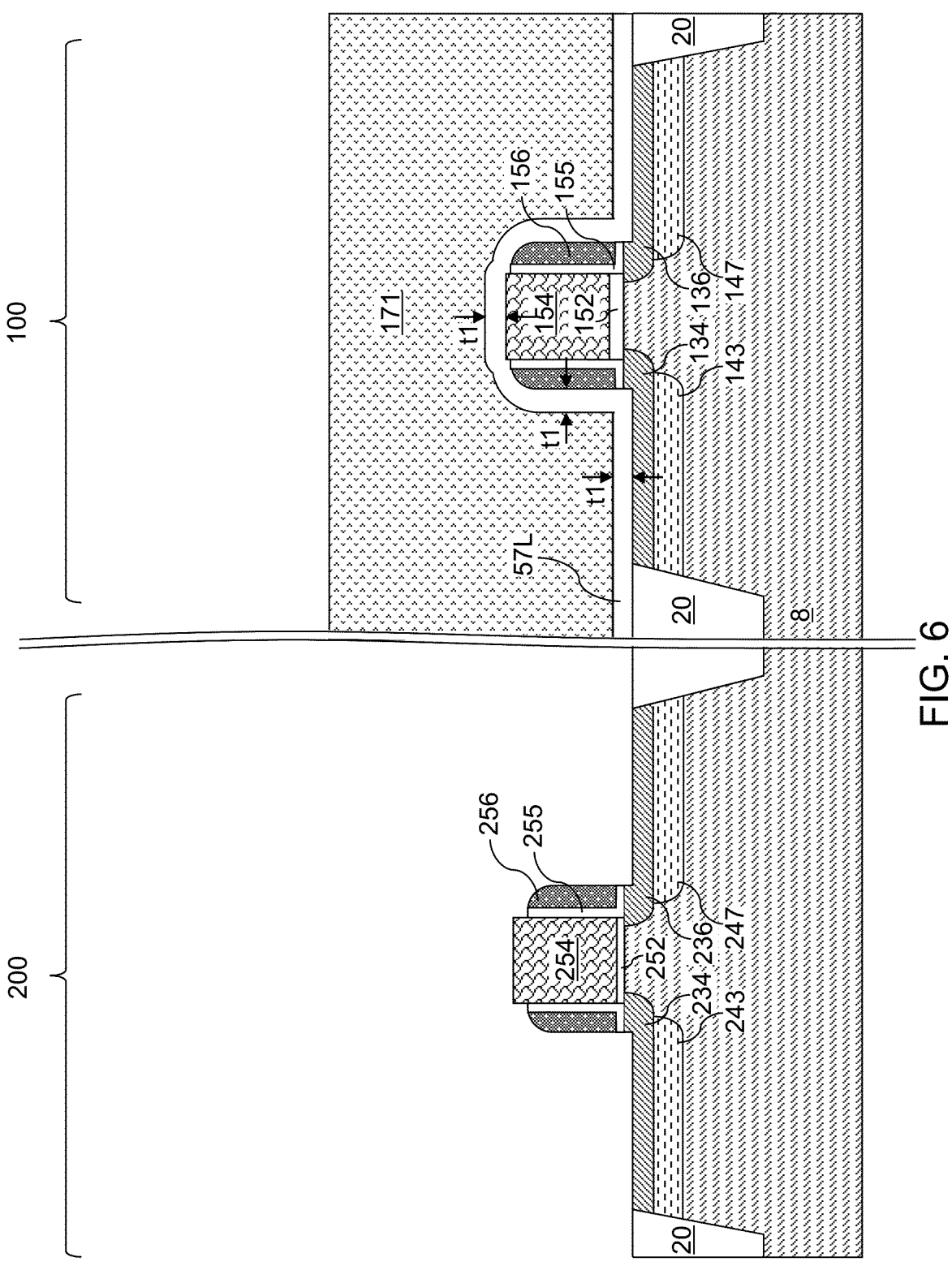
FIG. 6 is a vertical cross-sectional view of the exemplary structure after removing the capping dielectric material layer from a second device region according to an embodiment of the present disclosure.

Referring to FIG. 6, a first photoresist layer 171 can be applied over the exemplary structure, and can be lithographically patterned to cover the second device region 200 without covering the first device region 100. Thus, the first source/drain extension regions (134, 136) and the combination of the first gate dielectric 152, the first gate electrode 154, the first dielectric gate liner 155, and the first inner gate spacer 156 can be covered by the first photoresist layer 171, while the second source/drain extension regions (234, 236) and the combination of the second gate dielectric 252, the second gate electrode 254, the second dielectric gate liner 255, and the second inner gate spacer 256 are not coveted by the first photoresist layer 171. An etch process that removes the material of the capping dielectric material layer 57L can be performed using the first photoresist layer 171 as an etch mask. The etch process may comprise an anisotropic etch process (such as a reactive ion etch process) or an isotropic etch process (such as a wet etch process). The etch process may be selective to the semiconductor material of the second source/drain extension regions (234, 236), the second inner gate spacer 256, and the second gate electrode 254. Generally, the second portion of the capping dielectric material layer 57L that overlies the second portion of the semiconductor substrate 8 can be removed without removing the first portion of the capping dielectric material layer 57L that overlies the first portion of the semiconductor substrate 8.

Figure 7:
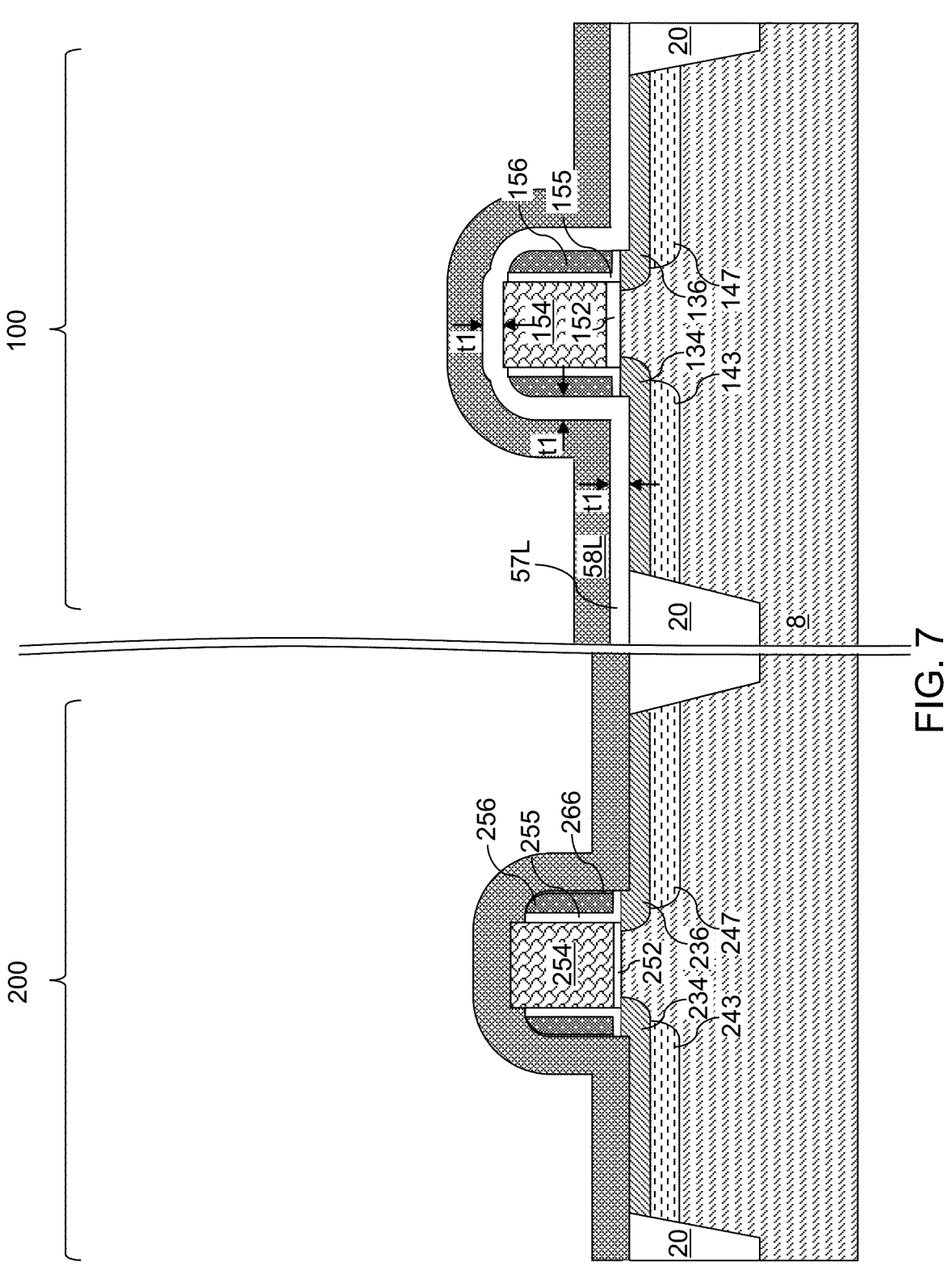
FIG. 7 is a vertical cross-sectional view of the exemplary structure after formation of an outer spacer material layer according to an embodiment of the present disclosure.

Referring to FIG. 7, an outer spacer material layer 58L can be formed over the first portion the capping dielectric material layer 57L, over the combination of the second gate dielectric 252, the second gate electrode 254, the second dielectric gate liner 255, and the second inner gate spacer 256, and over the physically exposed surface of the various source/drain extension regions (134, 136, 234, 236) and the shallow trench isolation structures 20. In one embodiment, the outer spacer material layer 58L may be deposited directly on an outer sidewall of the second inner gate spacer 256. Alternatively, a native oxide layer 266 having a thickness less than 1 nm, and typically in a range from 0.1 nm to 0.3 nm, may be formed on the physically exposed outer sidewall of the second inner gate spacer 256 during exposure of the outer sidewall of the second inner gate spacer 256 to the ambient prior to deposition of the outer spacer material layer 58L. In this embodiment, the outer spacer material layer 58L may be formed directly on a native oxide layer 266 having a thickness less than 1 nm and located directly on the outer sidewall of the second inner gate spacer 256. Generally, the outer spacer material layer 58L may be deposited directly on an outer sidewall of the second inner gate spacer 256, or may be deposited directly on a native oxide layer 266 having a thickness less than 1 nm and located directly on the outer sidewall of the second inner gate spacer 256.

In one embodiment, the outer spacer material layer 58L comprises, and/or consists essentially of, a second silicon nitride material. In one embodiment, the outer spacer material layer 58L may be formed by a low pressure chemical vapor deposition process using dichlorosilane and ammonia as reactant gases. In this embodiment, the deposition pressure may be in a range from 50 mTorr to 200 mTorr, and the deposition temperature may be in a range from 700 degrees Celsius to 800 degrees Celsius. As a conformal material layer, the thickness of the outer spacer material layer 58L may be uniform throughout. The thickness of the outer spacer material layer 58L may be in a range from 15 nm to 60 nm, such as from 20 nm to 50 nm, and/or from 25 nm to 40 nm, although lesser and greater thicknesses may also be used.

Figure 8:
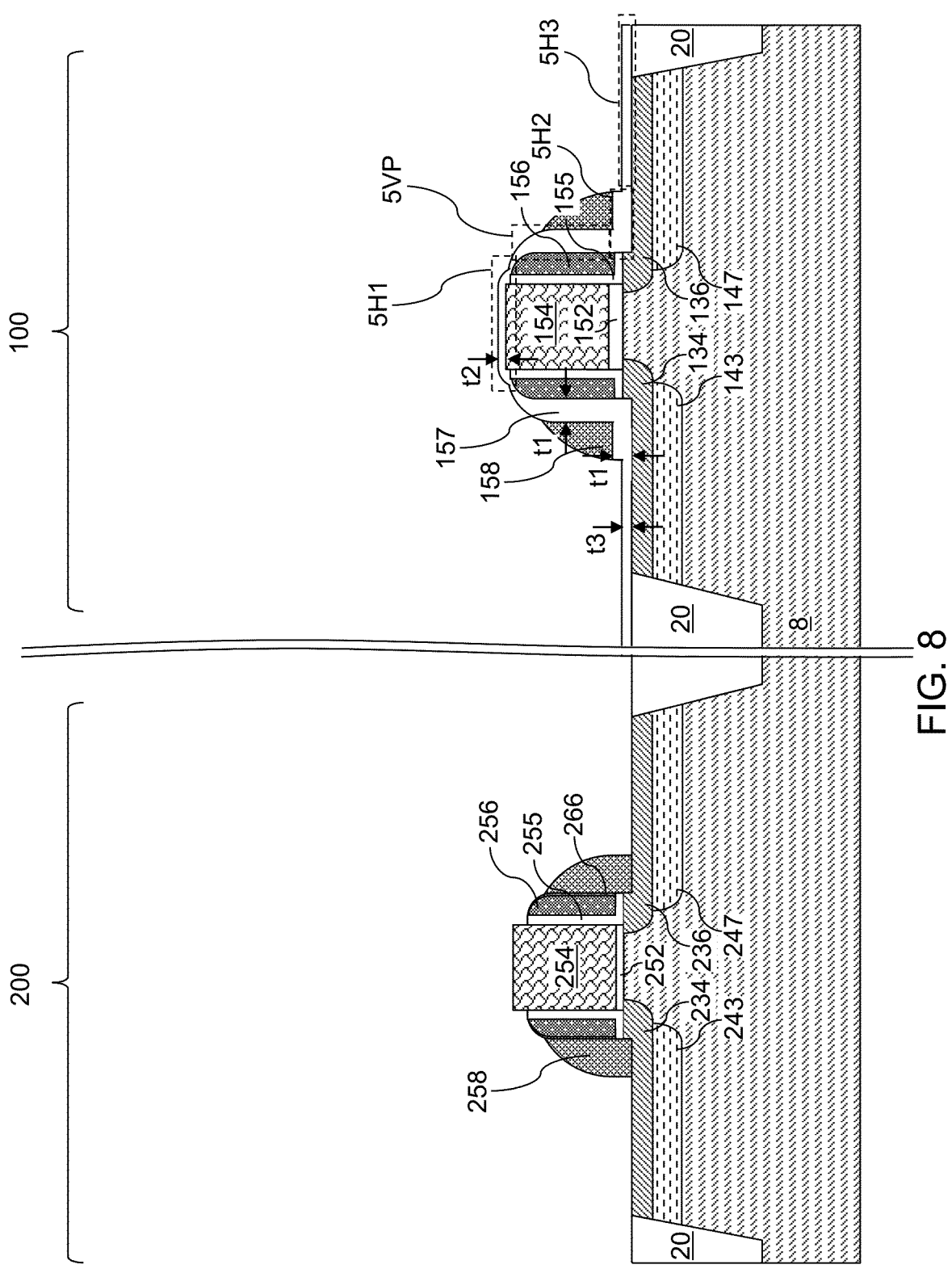
FIG. 8 is a vertical cross-sectional view of the exemplary structure after formation of a contoured gate capping dielectric and outer gate spacers according to an embodiment of the present disclosure.

Referring to FIG. 8, a second anisotropic etch process can be performed to sequentially etch the outer spacer material layer 58L and the capping dielectric material layer 57L. The second anisotropic etch process may comprise a first anisotropic etch step during which horizontally-extending portions of the outer spacer material layer 58L are anisotropically etched. Remaining portions of the outer spacer material layer 58L comprise a first outer gate spacer 158 that is formed in the first device region 100, and a second outer gate spacer 258 that is formed in the second device region 200.

The second anisotropic etch process may comprise a second anisotropic etch step that anisotropically etches the dielectric material of the capping dielectric material layer 57L selective to the semiconductor material of the second source/drain extension regions (234, 236) in the second device region 200, the material of the second inner gate spacer 255, and selective to the material of the second gate electrode 254. If the capping dielectric material layer 57L comprises a second silicon oxide material, the second anisotropic etch step of the second anisotropic etch process may comprise a reactive ion etch process using a gas mixture containing a fluorocarbon gas (such as $CF_4$ or $CHF_3$) and oxygen. The fluorocarbon gas can selectively etch silicon oxide by forming volatile silicon-fluorine compounds (such as $SiF_4$) and volatile carbon-oxygen compounds (such as CO or $CO_2$), while the oxygen is used to form a passivation layer on silicon surfaces and silicon nitride surfaces to prevent, and/or retard, etching of the silicon surfaces and the silicon nitride surfaces.

According to an aspect of the present disclosure, the duration of the second anisotropic etch step of the second anisotropic etch process can be selected such that the etch depth into the capping dielectric material layer 57L is less than the uniform thickness, i.e., the first thickness t1, of the capping dielectric material layer 57L. For example, the etch depth of the second anisotropic etch step of the second anisotropic etch process may be in a range from 10% to 60% of the first thickness t1. Thus, horizontally-extending portions of the capping dielectric material layer 57L are only vertically recessed, but are not completely removed, during the second anisotropic etch step of the second anisotropic etch process.

Generally, at least one anisotropic etch process can be performed to anisotropically etch the outer spacer material layer 58L and the first portion of the capping dielectric material layer 57L. The first outer gate spacer 158 and the second outer gate spacer 258 comprise patterned portions of the outer spacer material layer 58L. A remaining patterned remaining portion of the first portion of the capping dielectric material layer 57L comprises a contoured dielectric structure that covers, i.e., caps, a combination of the first gate dielectric 152, the first gate electrode 154, the first dielectric gate liner 155, and the first inner gate spacer 156. The contoured dielectric structure is herein referred to as a contoured gate capping dielectric 157. The contoured gate capping dielectric 157 comprises a vertically-extending portion 5VP that laterally surrounds the first inner gate spacer 156 and having a first thickness t1, a first horizontally-extending portion 5H1 that overlies the first gate electrode 154 and having a second thickness t2 that is less than the first thickness t1, a second horizontally-extending portion 5H2 that is adjoined to, and extends outward from, a bottom portion of the vertically-extending portion 5VP and having a uniform vertical thickness that equals the first thickness t1, and a third horizontally-extending portion 5H3 that does not underlie the first outer gate spacer 158 and horizontally extends outward outside the outer periphery of the first outer gate spacer 158 with a uniform third thickness t3. The contoured gate capping dielectric 157 is formed over, and around, the first inner gate spacer 156, and overlies the first inner gate spacer 156.

The second thickness t2 and the third thickness t3 may be in a range from 40% to 90%, such as from 50% to 80%, of the first thickness t1. Generally, the second thickness t2 and the third thickness t3 can be optimized to reduce barrier effect during a subsequent ion implantation process that forms source regions and drain regions, while providing a sufficient thickness over the first gate electrode 154 to ensure that leakage current is eliminated or reduced. It is preferable to have a reduced third thickness t3 to minimize changes in the profile of source/drain regions to be subsequently formed underneath. Also, it is preferable to increase the second thickness t2 to minimize or eliminate the leakage current from the first gate electrode 154 into dielectric materials to be subsequently formed to provide a contact-level dielectric layer. Since the third thickness t3 and the second thickness t2 are identical, or differ from each other only through pattern factor effects during the second anisotropic etch step of the second anisotropic etch process, selection of the second thickness t2 and the third thickness t3 within range from 40% to 90% provides an optimal compromise.

The first outer gate spacer 158 laterally surrounds the vertically-extending portion 5VP of the contoured gate capping dielectric 157, and overlies the second horizontally-extending portion 5H2 of the contoured gate capping dielectric 157. The vertically-extending portion 5VP of the contoured gate capping dielectric 157 has the first thickness t1, which may be in a range from 10 nm to 60 nm. In one embodiment, each surface segment of the first inner gate spacer 156 may be in contact with a respective surface segment of a combination of the first dielectric gate liner 155 and the contoured capping first gate dielectric 152.

The second outer gate spacer 258 laterally surrounds the second inner gate spacer 256, and has a same material composition as the first outer gate spacer 158. The second outer gate spacer 258 may be in direct contact with the second inner gate spacer 256, or may be spaced from the second inner gate spacer 256 by a native oxide layer 266 having a thickness less than 1 nm. The entirety of the contoured gate capping dielectric 157 may have a homogeneous dielectric material composition throughout. In one embodiment, the entirety of the contoured gate capping dielectric 157 may comprise, and/or may consist essentially of, the second silicon oxide material.

In one embodiment, the first source extension region 134 comprises a first topmost source extension surface segment that contacts a bottom surface of the first dielectric gate liner 155 and a first recessed source extension surface segment that contacts a bottom surface of the second horizontally-extending portion 5H2 of the contoured gate capping dielectric 157. In one embodiment, the first drain extension region 136 comprises a first topmost drain extension surface segment that contacts the bottom surface of the first dielectric gate liner 155 and a first recessed drain extension surface segment that contacts the bottom surface of the second horizontally-extending portion 5H2 of the contoured gate capping dielectric 157.

Figure 9:
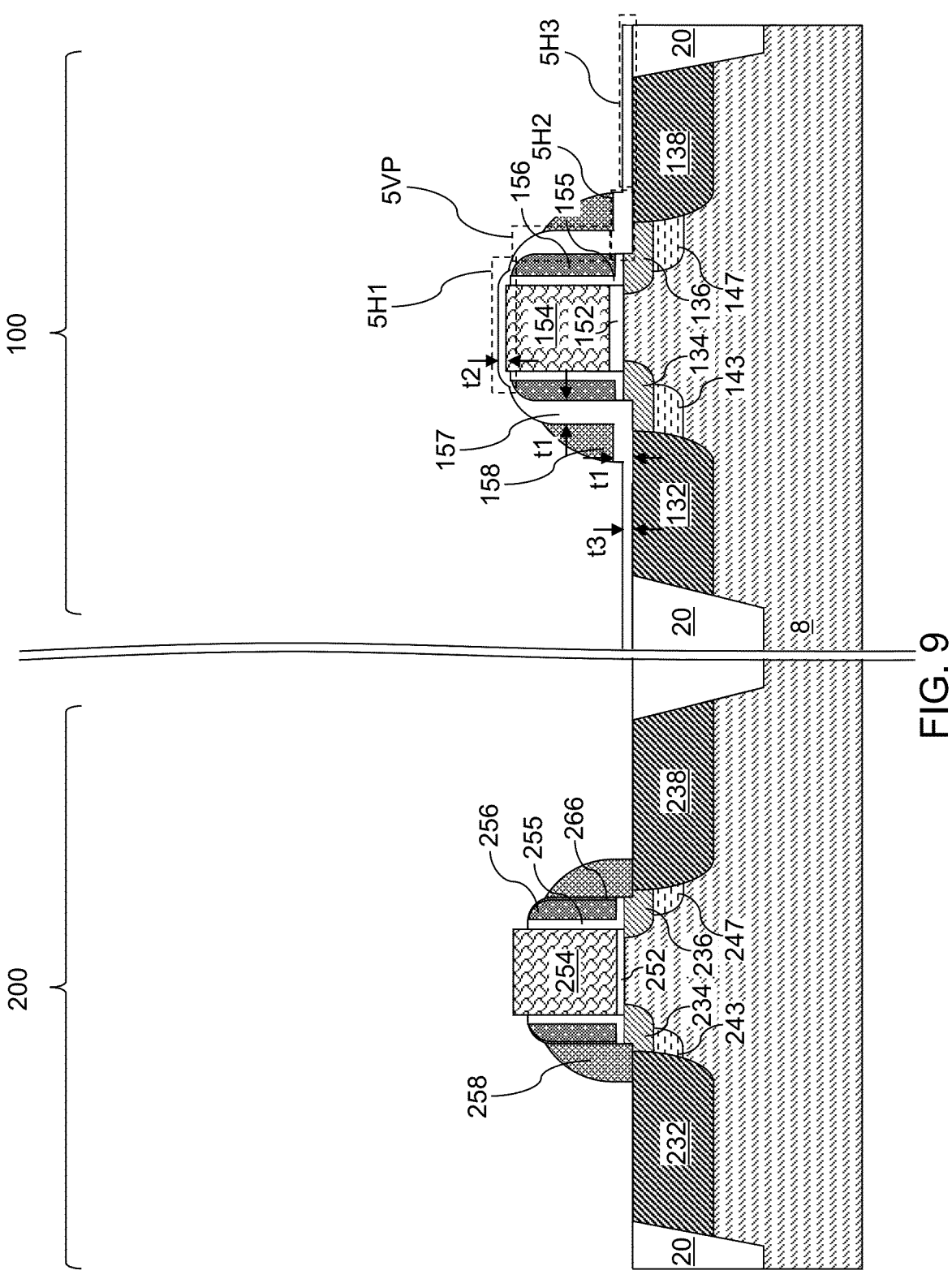
FIG. 9 is a vertical cross-sectional view of the exemplary structure after formation of source regions and drain regions according to an embodiment of the present disclosure.

Referring to FIG. 9, a third ion implantation process can be performed to implant dopants of the second conductivity type into portions of the semiconductor substrate 8 that are not masked by the gate electrodes (154, 254), the dielectric gate liners (155, 255), the inner gate spacers (156, 256), portions of the contoured gate capping dielectric 157 other than the third horizontally-extending portion 5H3, and the outer gate spacers (158, 258). The gate electrodes (154, 254), the dielectric gate liners (155, 255), the inner gate spacers (156, 256), portions of the contoured gate capping dielectric 157 other than the third horizontally-extending portion 5H3, and the outer gate spacers (158, 258) are used as components of a third ion implantation mask during the third ion implantation process.

Source/drain regions (132, 138, 232, 238) having a doping of the second conductivity type can be formed in the implanted portions of the semiconductor substrate 8. The source/drain regions (132, 138, 232, 238) may comprise a first source region 132, a first drain region 138, a second source region 232, and a second drain region 238. The net concentration of dopants of the second conductivity type, i.e., the difference between the atomic concentration of dopants of the second conductivity type and the atomic concentration of dopants of the first conductivity type, in the source/drain regions (132, 138, 232, 238) may be in a range from $5.0\times10^{19}/cm^3$ to $2.0\times10^{21}/cm^3$, such as from $1.0\times10^{20}/cm^3$ to $1.0\times10^{21}/cm^3$, although lesser and greater net dopant concentrations may also be used. The vertical thickness of the source/drain regions (132, 138, 232, 238) may be in a range from 40 nm to 400 nm, such as from 80 nm to 200 nm, although lesser and greater thicknesses may also be used.

Generally, the first source region 132 and the first drain region 138 can be formed in the first portion of the semiconductor substrate 8 adjacent to the combination of the contoured gate capping dielectric 157 and the first outer gate spacer 158 by performing an ion implantation process that uses the first outer gate spacer 158 and the contoured gate capping dielectric 157 as components of an implantation mask. The first source region 132 and the first drain region 138 can be formed by implantation of atoms of a dopant species of the second conductivity type through the third horizontally-extending portion 5H3 of the contoured gate capping dielectric 157. In one embodiment, the second horizontally-extending portion 5H2 of the contoured first gate dielectric 152 contacts a topmost surface of the first source region 132 and a topmost surface of the first drain region 138.

The first source extension region 134 is adjoined to the first source region 132, and the first drain extension region 136 is adjoined to the first drain region 138. The first source extension region 134 comprises a first topmost source extension surface segment that contacts a bottom surface of the first dielectric gate liner 155 and a first recessed source extension surface segment that contacts a bottom surface of the second horizontally-extending portion 5H2 of the contoured gate capping dielectric 157. The second horizontally-extending portion 5H2 of the contoured gate capping dielectric 157 may contact a topmost surface of the first source region 132 and a topmost surface of the first drain region 138. The second source region 232 and the second drain region 238 are embedded in the second portion of the semiconductor substrate 8.

Figure 10:
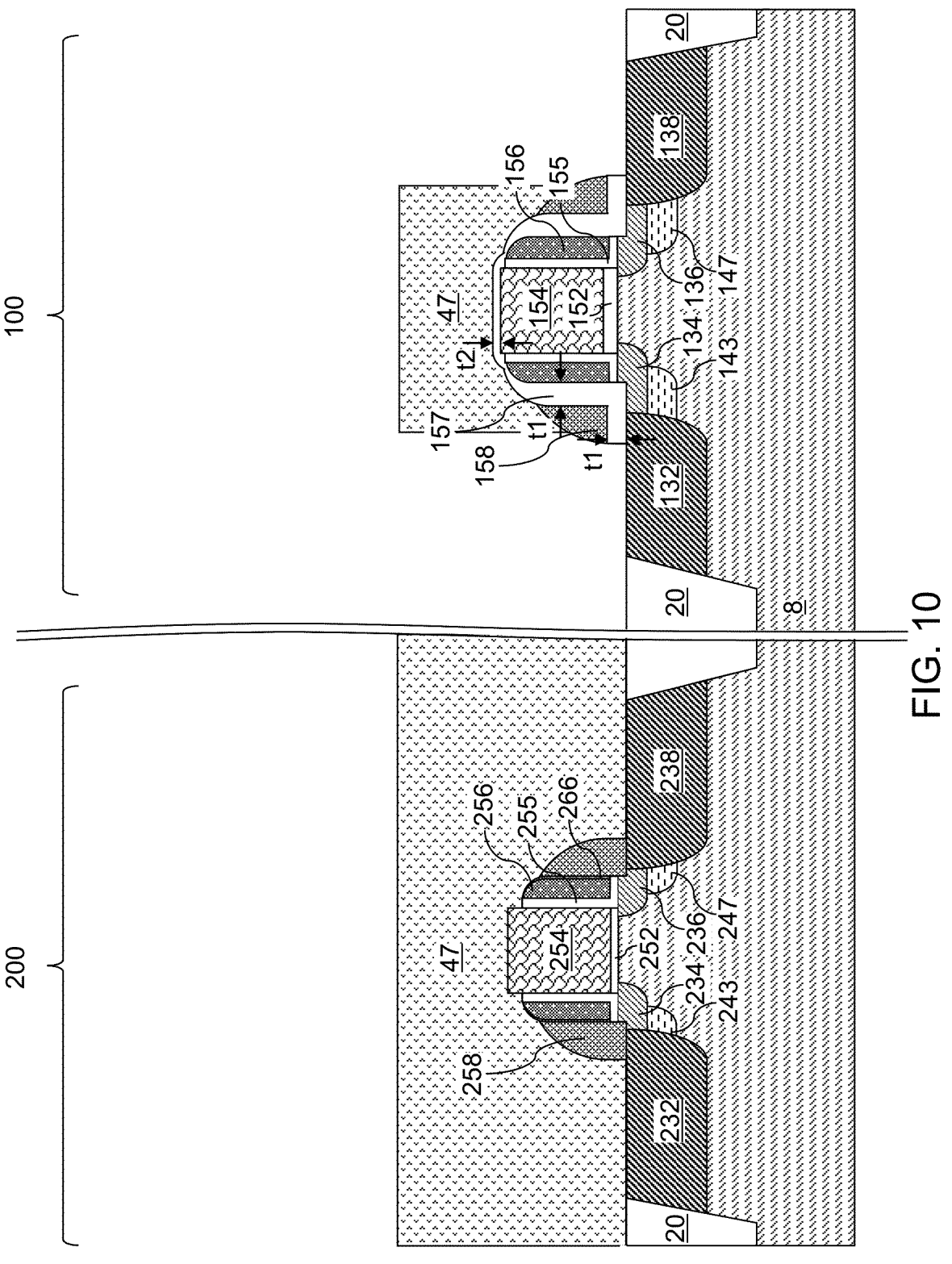
FIG. 10 is a vertical cross-sectional view of the exemplary structure after removal of a horizontally-extending portion of the contoured gate capping dielectric according to an embodiment of the present disclosure.

Referring to FIG. 10, a second photoresist layer 47 can be applied over the exemplary structure, and can be lithographically patterned to cover the second device region 200 and the area of the assembly of the first gate electrode 152, the first gate electrode 154, the first dielectric gate liners 155, the first inner gate spacer 157, portions of the contoured gate capping dielectric 157 other than the third horizontally-extending portion 5H3, and the first outer gate spacer 158, without covering the third horizontally-extending portion 5H3 of the contoured gate capping dielectric 157. An etch process can be performed to remove the third horizontally-extending portion 5H3 of the contoured gate capping dielectric 157 selective to the semiconductor material within the semiconductor substrate 8. For example, a wet etch process using dilute hydrofluoric acid may be performed to remove the third horizontally-extending portion 5H3 of the contoured gate capping dielectric 157. Alternatively, an anisotropic etch process such as a reactive ion etch process may be performed to remove the third horizontally-extending portion 5H3 of the contoured gate capping dielectric 157. The second photoresist layer 47 can be subsequently removed, for example, by ashing.

Figure 11:
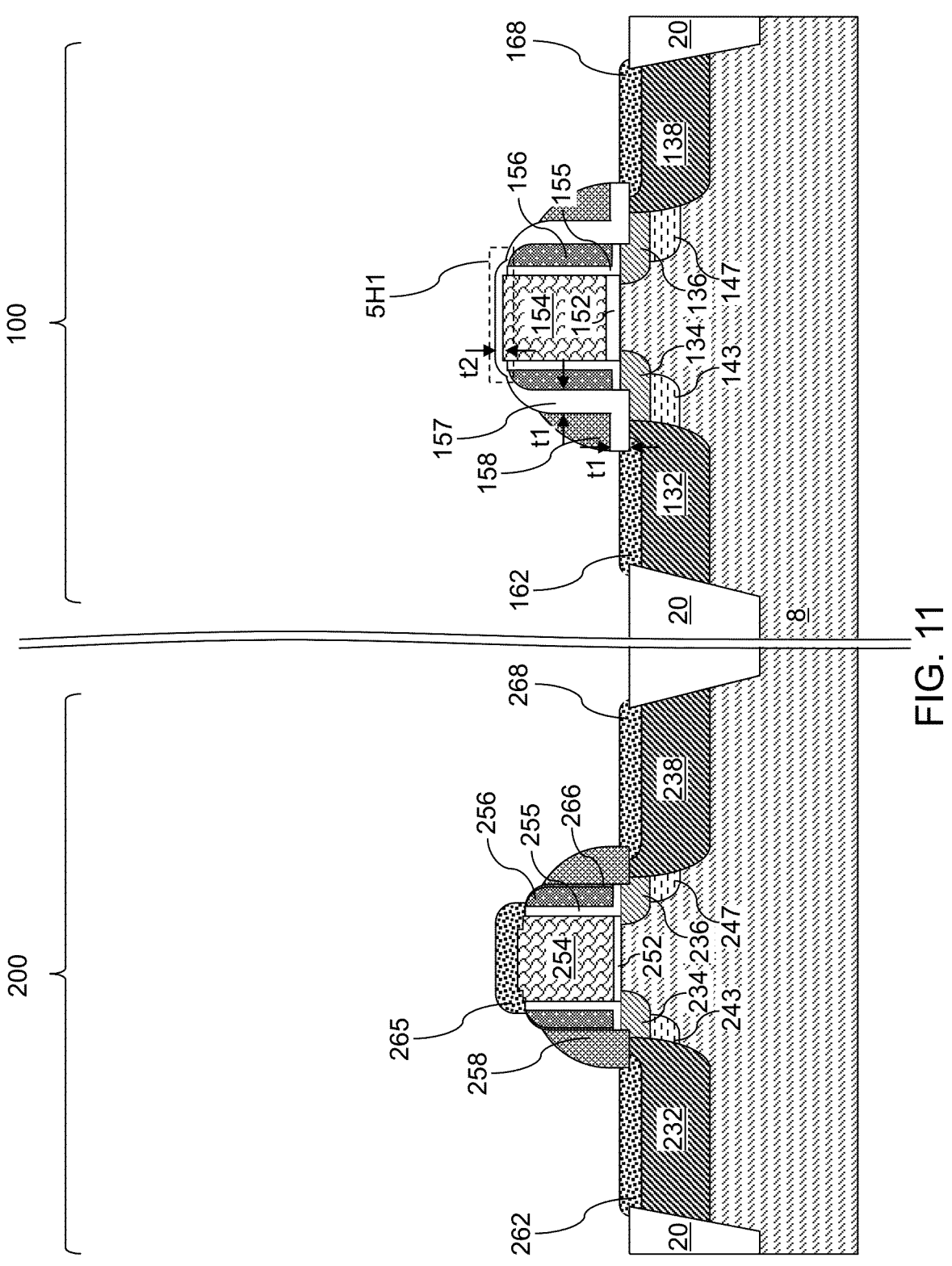
FIG. 11 is a vertical cross-sectional view of the exemplary structure after formation of metal-semiconductor alloy portions according to an embodiment of the present disclosure.

Referring to FIG. 11, a metal layer (not illustrated) having a thickness in a range from 6 nm to 30 nm may be deposited on the physically exposed semiconductor surfaces of the exemplary structure. The metal layer may comprise, and/or may consist essentially of, at least one metal that forms a metal-semiconductor ally upon reaction with the semiconductor material of the source/drain extension regions (134, 136, 234, 236) and upon reaction with the semiconductor material of the second gate electrode 254 (in embodiments in which the second gate electrode 254 comprises a semiconductor material). For example, the metal layer may comprise, and/or may consist essentially of, titanium, nickel, cobalt, tungsten, molybdenum, ruthenium, platinum, palladium, etch. Other suitable metal layer materials may be within the contemplated scope of disclosure.

A thermal anneal process can be performed to induce reaction between the metal element(s) in the metal layer and the semiconductor material of the source/drain extension regions (134, 136, 234, 236), and between the metal element(s) in the metal layer and the semiconductor material of the second gate electrode 254. The elevated temperature of the thermal process depends on the species of the metal(s), and may be generally in a range from 400 degrees Celsius to 800 degrees Celsius.

Various metal-semiconductor alloy portions (162, 168, 262, 268, 265) including a metal-semiconductor alloy (such as a metal silicide material) can be formed. The metal-semiconductor alloy portions (162, 168, 262, 268, 265) may comprise a first source-side metal-semiconductor alloy portion 162 that is formed on the first source extension region 132, a first drain-side metal-semiconductor alloy portion 168 that is formed on the first drain extension region 138, a second source-side metal-semiconductor alloy portion 262 that is formed on the second source extension region 232, a second drain-side metal-semiconductor alloy portion 268 that is formed on a second drain extension region 238, and a gate metal-semiconductor alloy portion 265 that is formed on the second gate electrode 254. The first gate electrode 154 is spaced from the metal layer by the first horizontally-extending portion 5H1 of the contoured gate capping dielectric 157, and thus, no metal-semiconductor alloy portion is formed on the first gate electrode 154. The various metal-semiconductor alloy portions (162, 168, 262, 268, 265) may have a thickness in a range from 10 nm to 50 nm, such as from 20 nm to 40 nm, although lesser and greater thicknesses may also be used. Unreacted portions of the metal layer can be removed by performing a wet etch process that etches the metal(s) within the metal layer selective to the metal-semiconductor alloy portions (162, 168, 262, 268, 265) and various dielectric materials in the exemplary structure.

Figure 12:
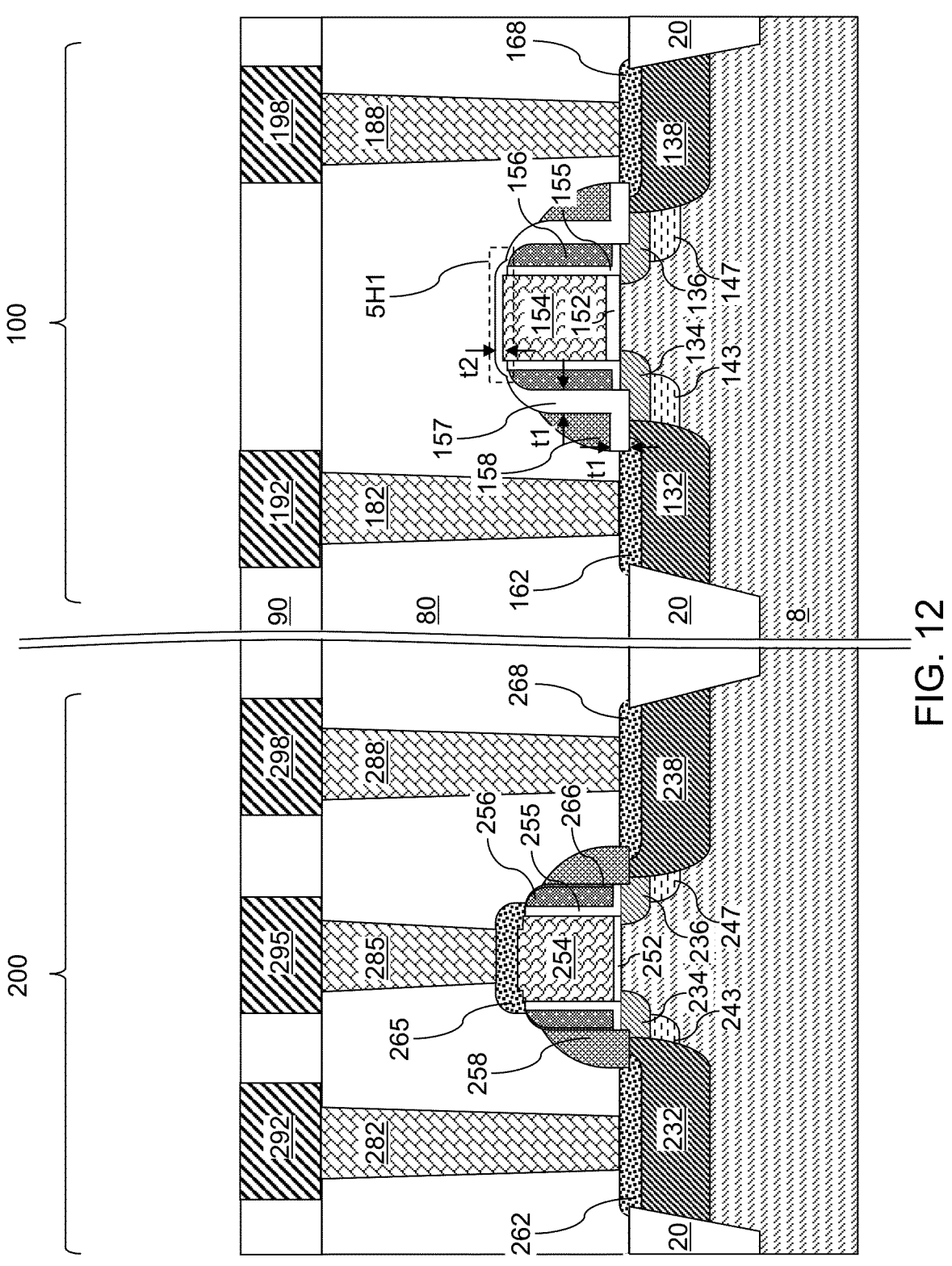
FIG. 12 is a vertical cross-sectional view of the exemplary structure after formation of a contact-level dielectric layer, contact via structures, a line-level dielectric layer, and metal line structures according to an embodiment of the present disclosure.

Referring to FIG. 12, a contact-level dielectric layer 80 can be formed over the metal-semiconductor alloy portions (162, 168, 262, 268, 265), the gate electrodes (154, 254), and the various dielectric structures that laterally surround the gate electrodes (154, 254). The contact-level dielectric layer 80 comprises an interlayer dielectric (ILD) material such as silicon oxide formed by plasma decomposition of tetraethylorthosilicate.

Plasma decomposition of tetraethylorthosilicate deposits a silicon oxide material at a high deposition rate relative to a low pressure chemical vapor deposition of tetraethylorthosilicate that provides a low deposition rate. The thickness of the contact-level dielectric layer 80, as measured above the shallow trench isolation structures 20, is greater than the height of the highest point of the gate structure by at least 50 nm, and preferably by a dimensional in a range from 100 nm to 300 nm. Thus, use of plasma-enhanced chemical vapor deposition for the purpose of depositing the contact-level dielectric layer 80 provides a suitable high deposition rate for formation of the contact-level dielectric layer 80. However, direct contact between a silicon oxide material formed by plasma-assisted decomposition of tetraethylorthosilicate causes significant leakage current from the first gate electrode 154 (which functions as a floating gate structure) into such a silicon oxide material formed by plasma-assisted decomposition of tetraethylorthosilicate. According to an aspect of the present disclosure, presence of the first horizontally-extending portion 5H1 of the contoured gate capping dielectric 157 between the first gate electrode 154 and the contact-level dielectric layer 80 suppresses leakage current from the first gate electrode 154 into the dielectric material of the contact-level dielectric layer 80, and thus, enhances the reliability of the floating gate device including the first gate electrode 154.

Contact via structures (182, 188, 282, 288, 285) can be formed through the contact-level dielectric layer 80. The contact via structures (182, 188, 282, 288, 285) may comprise a first source-side contact via structure 182 contacting the first source-side metal-semiconductor alloy portion 162, a first drain-side contact via structure 188 contacting the first drain-side metal-semiconductor alloy portion 168, a second source-side contact via structure 282 contacting the second source-side metal-semiconductor alloy portion 262, a second drain-side contact via structure 288 contacting the second drain-side metal-semiconductor alloy portion 268, and a gate contact via structure 285 contacting the gate metal-semiconductor alloy portion 265. The prevents leakage current A line-level dielectric layer 90 can be formed over the contact-level dielectric layer 80. Metal lines (192, 198, 292, 298, 295) can be formed through the line-level dielectric layer 90. The metal lines (192, 198, 292, 298, 295) may comprise a first source-side metal line 192 contacting the first source-side contact via structure 182, a first drain-side metal line 198 contacting the first drain-side contact via structure 188, a second source-side metal line 292 contacting the second source-side contact via structure 282, a second drain-side metal line 298 contacting the second drain-side contact via structure 288, and a gate metal line 295 contacting the gate contact via structure 285. Additional dielectric material layers (not shown) and additional metal interconnect structures (not shown) may be formed as needed.

Referring to FIG. 13, a first flow chart illustrates a general sequence of processing steps that can be used to form a semiconductor device of the present disclosure such as the exemplary structure described with reference to FIGS. 1-12. The processing steps used in the first flow chart comprises a first subset of the set of processing steps described with reference to FIGS. 1-12. In one embodiment, processing steps that are not expressly listed in the first flow chart may be optionally omitted. In the method shown in the first flow chart, a first outer gate spacer 158, a first source region 132, and a second first drain region 138 are formed as a component of a device structure.

Referring to step 1310 and FIGS. 1 and 2, a first gate dielectric 152 and a first gate electrode 154 can be formed over a first portion of a semiconductor substrate 8.

Referring to step 1320 and FIGS. 3 and 4, a combination of a first dielectric gate liner 155 and a first inner gate spacer 156 can be formed around the first gate electrode 154.

Referring to step 1330 and FIGS. 5-8, a combination of a contoured gate capping dielectric 157 and a first outer gate spacer 158 can be formed. The contoured gate capping dielectric 157 comprises a vertically-extending portion 5VP that laterally surrounds the first inner gate spacer 156 and a first horizontally-extending portion 5H1 that overlies the first gate electrode 154, and the first outer gate spacer 158 laterally surrounds the contoured gate capping dielectric 157.

Referring to step 1340 and FIGS. 9-12, a first source region 132 and a first drain region 138 can be formed in the first portion of the semiconductor substrate 8 adjacent to the combination of the contoured gate capping dielectric 157 and the first outer gate spacer 158.

In one embodiment, the method further comprises: forming a capping dielectric material layer 57L over the combination of the first dielectric gate liner 155 and the first inner gate spacer 156; forming an outer spacer material layer 58L over a first portion the capping dielectric material layer 57L; and anisotropically etching the outer spacer material layer 58L and the first portion of the capping dielectric material layer 57L, wherein the contoured gate capping dielectric 157 comprises a patterned portion of the capping dielectric material layer 57L, and the first outer gate spacer 158 comprises a patterned portion of the outer spacer material layer 58L.

In one embodiment, the contoured gate capping dielectric 157 comprises a second horizontally-extending portion 5H2 that underlies the first outer gate spacer 158 and a third horizontally-extending portion 5H3 that does not underlie the first outer gate spacer 158; the first source region 132 and the first drain region 138 may be formed by implantation of atoms of a dopant species through the third horizontally-extending portion 5H3 of the contoured gate capping dielectric 157; and the method comprises removing the third horizontally-extending portion 5H3 of the contoured gate capping dielectric 157 after formation of the first source region 132 and the first drain region 138.

In one embodiment, the method comprises: forming a second gate dielectric 252 and a second gate electrode 254 over a second portion of the semiconductor substrate 8; forming a combination of a second dielectric gate liner 255 and a second inner gate spacer 256 around the second gate electrode 254; removing a second portion of the capping dielectric material layer 57L overlying the second portion of the semiconductor substrate 8 without removing the first portion of the capping dielectric material layer 57L.

In one embodiment, the method comprises: conformally depositing a dielectric liner material layer 55L and an inner spacer material layer over the first gate electrode 154; and anisotropically etching the inner spacer material layer and the dielectric liner material layer 55L, wherein the first dielectric gate liner 155 comprises a remaining portion of the dielectric liner material layer 55L, and the first inner gate spacer 156 comprises a remaining portion of the inner spacer material layer.

Referring to FIG. 14, a second flow chart illustrates a general sequence of processing steps that can be used to form a semiconductor device of the present disclosure such as the exemplary structure described with reference to FIGS. 1-12. The processing steps used in the second flow chart comprises a second subset of the set of processing steps described with reference to FIGS. 1-12. In one embodiment, processing steps that are not expressly listed in the second flow chart may be optionally omitted. In the method shown in the second flow chart, in addition to a vertically-extending portion 5VP having a first thickness t1 and a first horizontally-extending portion 5H1, the contoured gate capping dielectric 157 further comprises a second horizontally-extending portion 5H2 that is adjoined to, and extends outward from, a bottom portion of the vertically-extending portion 5VP and having a uniform vertical thickness that equals the first thickness t1.

Referring to step 1410 and FIGS. 1 and 2, a first gate dielectric 152 and a first gate electrode 154 can be formed over a first portion of a semiconductor substrate 8.

Referring to step 1420 and FIGS. 3 and 4, a first dielectric gate liner 155 and a first inner gate spacer 156 can be formed around the first gate electrode 154. The first inner gate spacer 156 laterally surrounds the first dielectric gate liner 155.

Referring to step 1430 and FIGS. 5-12, a contoured gate capping dielectric 157 can be formed over, and around, the first inner gate spacer 156. The contoured gate capping dielectric 157 comprises a vertically-extending portion 5VP that laterally surrounds the first inner gate spacer 156 and having a first thickness t1, a first horizontally-extending portion 5H1 that overlies the first gate electrode 154 and having a second thickness t2 that is less than the first thickness t1, and a second horizontally-extending portion 5H2 that is adjoined to, and extends outward from, a bottom portion of the vertically-extending portion 5VP and having a uniform vertical thickness that equals the first thickness t1.

In one embodiment, the method comprises forming a first outer gate spacer 158 that laterally surrounds the vertically-extending portion 5VP of the contoured gate capping dielectric 157 and overlies the second horizontally-extending portion 5H2 of the contoured gate capping dielectric 157. In one embodiment, the method comprises forming a first source region 132 and a first drain region 138 in the first portion of the semiconductor substrate 8 by performing an ion implantation process that uses the first outer gate spacer 158 and the contoured gate capping dielectric 157 as components of an implantation mask.

In one embodiment, the method comprises: forming a capping dielectric material layer 57L over the first dielectric gate liner 155 and the first inner gate spacer 156; and patterning the capping dielectric material layer 57L, wherein the contoured gate capping dielectric 157 comprises a patterned portion of the capping dielectric material layer 57L. In one embodiment, the method comprises: forming a second gate dielectric 252 and a second gate electrode 254 over a second portion of the semiconductor substrate 8; and forming a second dielectric gate liner 255 and a second inner gate spacer 256 around the second gate electrode 254, wherein a first portion of the capping dielectric material layer 57L may be formed over the first portion of the semiconductor substrate 8 and a second portion of the capping dielectric material layer 57L is formed over the second portion of the semiconductor substrate 8. In one embodiment, the method comprises removing the second portion of the capping dielectric material layer 57L without removing the first portion of the capping dielectric material layer 57L.

In one embodiment, the method comprises: forming an outer spacer material layer 58L over the first portion the capping dielectric material layer 57L after removing the second portion of the capping dielectric material layer 57L; and performing at least one anisotropic etch process that anisotropically etches the outer spacer material layer 58L and the first portion of the capping dielectric material layer 57L, wherein the first outer gate spacer 158 comprises a patterned portion of the outer spacer material layer 58L. In one embodiment, the contoured gate capping dielectric 157 comprises a third horizontally-extending portion 5H3 that does not underlie the first outer gate spacer 158 after the at least one anisotropic etch process; the first source region 132 and the first drain region 138 are formed by implantation of atoms of a dopant species through the third horizontally-extending portion 5H3 of the contoured gate capping dielectric 157; and the method comprises removing the third horizontally-extending portion 5H3 of the contoured gate capping dielectric 157 after formation of the first source region 132 and the first drain region 138. In one embodiment, the outer spacer material layer 58L is deposited directly on an outer sidewall of the second inner gate spacer 256, or directly on a native oxide layer 266 having a thickness less than 1 nm and located directly on the outer sidewall of the second inner gate spacer 256.

In one embodiment, the method comprises: conformally depositing a dielectric liner material layer 55L over the first gate electrode 154; and forming a first source extension region 134 and a first drain extension region 136 by performing a first ion implantation process using vertically-extending portions of the dielectric liner material layer 55L as a component of a first ion implantation mask. In one embodiment, the method comprises: depositing an inner spacer material layer over the dielectric liner material layer 55L after the first ion implantation process; performing an anisotropic etch process that anisotropically etches the inner spacer material layer and the dielectric liner material layer 55L, wherein the first dielectric gate liner 155 comprises a remaining portion of the dielectric liner material layer 55L, and the first inner gate spacer 156 comprises a remaining portion of the inner spacer material layer. In one embodiment, the method comprises forming first compensation implantation regions (143, 147, 243, 247) by performing a second ion implantation process that implants dopants having a same conductivity type as the first portion of a semiconductor substrate 8 using the first inner gate spacer 156 and the first dielectric gate liner 155 as components of a second ion implantation mask.

Referring to FIG. 15, a third flow chart illustrates a general sequence of processing steps that can be used to form a semiconductor device of the present disclosure such as the exemplary structure described with reference to FIGS. 1-12. The processing steps used in the third flow chart comprises a third subset of the set of processing steps described with reference to FIGS. 1-12. In one embodiment, processing steps that are not expressly listed in the third flow chart may be optionally omitted. In the method shown in the third flow chart, the outer spacer material layer 58L and the first portion of the capping dielectric material layer 57L can be anisotropically etched such that a patterned remaining portion of the first portion of the capping dielectric material layer 57L comprises a contoured gate capping dielectric 157 overlying the first inner gate spacer 156 and comprising a vertically-extending portion 5VP that laterally surrounds the first inner gate spacer 156 and having a first thickness t1, and a first horizontally-extending portion 5H1 that overlies the first gate electrode 154 and having a second thickness t2 that is less than the first thickness t1.

Referring to step 1510 and FIGS. 1 and 2, a first gate dielectric 152 and a first gate electrode 154 can be formed over a first portion of a semiconductor substrate 8.

Referring to step 1520 and FIGS. 1 and 2, a second gate dielectric 252 and a second gate electrode 254 can be formed over a second portion of the semiconductor substrate 8.

Referring to step 1530 and FIGS. 3-5, a capping dielectric material layer 57L can be formed over the first gate electrode 154 and over the second gate electrode 254.

Referring to step 1540 and FIG. 6, a second portion of the capping dielectric material layer 57L that overlies the second portion of the semiconductor substrate 8 can be removed without removing a first portion of the capping dielectric material layer 57L that overlies the first portion of the semiconductor substrate 8.

Referring to step 1550 and FIG. 7, an outer spacer material layer 58L can be formed over the first portion of the capping dielectric material layer 57L and over the second gate electrode 254.

Referring to step 1560 and FIGS. 8-12, the outer spacer material layer 58L and the first portion of the capping dielectric material layer 57L can be anisotropically etched. A patterned remaining portion of the first portion of the capping dielectric material layer 57L comprises a contoured gate capping dielectric 157 overlying the first inner gate spacer 156 and comprising a vertically-extending portion 5VP that laterally surrounds the first inner gate spacer 156 and having a first thickness t1, and a first horizontally-extending portion 5H1 that overlies the first gate electrode 154 and having a second thickness t2 that is less than the first thickness t1.

In one embodiment, the contoured gate capping dielectric 157 comprises a second horizontally-extending portion 5H2 that is adjoined to, and extends outward from, a bottom portion of the vertically-extending portion 5VP and having a uniform vertical thickness that equals the first thickness t1. In one embodiment, first horizontally-extending portion 5H1 of the contoured gate capping dielectric 157 has a second thickness t2 that is in a range from 40% to 90% of the first thickness t1.

Referring to all drawings and according to various embodiments of the present disclosure, a semiconductor structure comprising a first field effect transistor is provided. The first field effect transistor comprises: a first source region 132 and a first drain region 138 embedded in a first portion of a semiconductor substrate 8; a first gate dielectric 152 overlying a first channel region located between the first source region 132 and the first drain region 138; a first gate electrode 154 overlying the first gate dielectric 152; a first dielectric gate liner 155 laterally surrounding the first gate electrode 154; a first inner gate spacer 156 laterally surrounding the first dielectric gate liner 155; a contoured gate capping dielectric 157 comprising a vertically-extending portion 5VP that laterally surrounds the first inner gate spacer 156 and a first horizontally-extending portion 5H1 that overlies the first gate electrode 154; and a first outer gate spacer 158 laterally surrounding the contoured gate capping dielectric 157.

In one embodiment, the contoured gate capping dielectric 157 comprises a second horizontally-extending portion 5H2 that is adjoined to a bottom region of the vertically-extending portion 5VP and underlies the first outer gate spacer 158. In one embodiment, the second horizontally-extending portion 5H2 of the contoured first gate dielectric 152 contacts a topmost surface of the first source region 132 and a topmost surface of the first drain region 138. In one embodiment, the first field effect transistor comprises: a first source extension region 134 adjoined to the first source region 132; and a first drain extension region 136 adjoined to the first drain region 138, wherein the first source extension region 134 comprises a first topmost source extension surface segment that contacts a bottom surface of the first dielectric gate liner 155 and a first recessed source extension surface segment that contacts a bottom surface of the second horizontally-extending portion 5H2 of the contoured gate capping dielectric 157. In one embodiment, the first source extension region 134 comprises a first vertically-extending surface segment that connects the first topmost source extension surface segment and the first recessed source extension surface segment, and is in contact with a vertical surface segment of the second horizontally-extending portion 5H2 of the contoured gate capping dielectric 157.

In one embodiment, the second horizontally-extending portion 5H2 of the contoured gate capping dielectric 157 has a first thickness t1; and the first horizontally-extending portion 5H1 of the contoured gate capping dielectric 157 has a second thickness t2 that is in a range from 40% to 90% of the first thickness t1. In one embodiment, a lateral thickness of the vertically-extending portion 5VP of the contoured gate capping dielectric 157 is the first thickness t1.

In one embodiment, each surface segment of the first inner gate spacer 156 is in contact with a respective surface segment of a combination of the first dielectric gate liner 155 and the contoured capping first gate dielectric 152. In one embodiment, the first dielectric gate liner 155 comprises a first silicon oxide material; the first inner gate spacer 156 comprises a first silicon nitride material; the contoured gate capping dielectric 157 comprises a second silicon oxide material; and the first outer gate spacer 158 comprises a second silicon nitride material.

In one embodiment, the semiconductor structure further comprises a second field effect transistor that comprises: a second source region 232 and a second drain region 238 embedded in a second portion of the semiconductor substrate 8; a second gate dielectric 252 overlying a second channel region located between the second source region 232 and the second drain region 238; a second gate electrode 254 overlying the second gate dielectric 252; a second dielectric gate liner 255 laterally surrounding the second gate electrode 254; a second inner gate spacer 256 laterally surrounding the second dielectric gate liner 255; and a second outer gate spacer 258 laterally surrounding the second inner gate spacer 256, wherein the second outer gate spacer 258 is in direct contact with the second inner gate spacer 256 or is spaced from the second inner gate spacer 256 by a native oxide layer 266 having a thickness less than 1 nm. In one embodiment, the vertically-extending portion 5VP of the contoured gate capping dielectric 157 has a thickness in a range from 10 nm to 60 nm.

According to another aspect of the present disclosure, a semiconductor structure comprising a first field effect transistor and a second field effect transistor is provided. The first field effect transistor comprises: a first source region 132 and a first drain region 138 embedded in a first portion of a semiconductor substrate 8; a first gate dielectric 152 and a first gate electrode 154; a first dielectric gate liner 155 laterally surrounding the first gate electrode 154; a first inner gate spacer 156 laterally surrounding the first dielectric gate liner 155; a contoured gate capping dielectric 157 comprising a vertically-extending portion 5VP that laterally surrounds the first inner gate spacer 156 and a first horizontally-extending portion 5H1 that overlies the first gate electrode 154; and a first outer gate spacer 158 laterally surrounding the contoured gate capping dielectric 157. The second field effect transistor that comprises: a second source region 232 and a second drain region 238 embedded in a second portion of the semiconductor substrate 8; a second gate dielectric 252 and a second gate electrode 254; a second dielectric gate liner 255 laterally surrounding the second gate electrode 254 and having a same material composition as the first dielectric gate liner 155; a second inner gate spacer 256 laterally surrounding the second dielectric gate liner 255 and having a same material composition as the first inner gate spacer 156; and a second outer gate spacer 258 laterally surrounding the second inner gate spacer 256 and having a same material composition as the first outer gate spacer 158, wherein the second outer gate spacer 258 is in direct contact with the second inner gate spacer 256 or is spaced from the second inner gate spacer 256 by a native oxide layer 266 having a thickness less than 1 nm.

In one embodiment, the contoured gate capping dielectric 157 comprises a second horizontally-extending portion 5H2 that is adjoined to a bottom region of the vertically-extending portion 5VP and underlies the first outer gate spacer 158. In one embodiment, the second horizontally-extending portion 5H2 of the contoured gate capping dielectric 157 has a first thickness t1; and the first horizontally-extending portion 5H1 of the contoured gate capping dielectric 157 has a second thickness t2 that is in a range from 40% to 90% of the first thickness t1. In one embodiment, all surface segments of the first gate electrode 154 is in contact with a respective surface segment of a combination of the first gate dielectric 152, the first dielectric gate liner 155, and the first horizontally-extending portion 5H1 of the contoured gate capping dielectric 157.

According to another aspect of the present disclosure, a semiconductor structure comprising a first field effect transistor is provided. The first field effect transistor comprises: a first source region 132 and a first drain region 138 embedded in a first portion of a semiconductor substrate 8; a first gate dielectric 152 and a first gate electrode 154 that overlie a first channel region located between the first source region 132 and the first drain region 138; a first dielectric gate liner 155 laterally surrounding the first gate electrode 154; a first inner gate spacer 156 laterally surrounding the first dielectric gate liner 155; and a contoured gate capping dielectric 157 comprising a vertically-extending portion 5VP that laterally surrounds the first inner gate spacer 156, a first horizontally-extending portion 5H1 that overlies the first gate electrode 154, and a second horizontally-extending portion 5H2 that is adjoined to a bottom region of the vertically-extending portion 5VP and contacting a topmost surface of the first source region 132 and a topmost surface of the first drain region 138.

In one embodiment, the first field effect transistor comprises a first outer gate spacer 158 laterally surrounding the vertically-extending portion 5VP of the contoured gate capping dielectric 157 and overlying the second laterally-extending portion of the contoured gate capping dielectric 157. In one embodiment, the first field effect transistor comprises: a first source extension region 134 adjoined to the first source region 132; and a first drain extension region 136 adjoined to the first drain region 138, wherein the first source extension region 134 comprises a first topmost source extension surface segment that contacts a bottom surface of the first dielectric gate liner 155 and a first recessed source extension surface segment that contacts a bottom surface of the second horizontally-extending portion 5H2 of the contoured gate capping dielectric 157.

In one embodiment, the second horizontally-extending portion 5H2 of the contoured gate capping dielectric 157 has a first thickness t1; and the first horizontally-extending portion 5H1 of the contoured gate capping dielectric 157 has a second thickness t2 that is in a range from 40% to 90% of the first thickness t1. In one embodiment, an entirety of the contoured gate capping dielectric 157 has a homogeneous dielectric material composition throughout; and a lateral thickness of the vertically-extending portion 5VP of the contoured gate capping dielectric 157 is the first thickness t1.

The various embodiments of the present disclosure can be used to provide a leakage-stopping dielectric material layer overlying a gate electrode 154 such that the gate electrode 154 can function as an effective floating gate electrode. Specifically, a contoured gate capping dielectric 157 including a leakage-stopping dielectric material such as a silicon oxide material formed by thermal decomposition of tetraethylorthosilicate may be used for a contoured gate capping dielectric. The horizontally-extending portions of the contoured gate capping dielectric that are not covered by an outer gate spacer 158 can be thinned to reduce impact on the profile of source region 132 and on the profile of the drain region 138. Further, the material layer used to form the contoured gate capping dielectric 157 can be removed from device areas that are not used to form a memory device, such as the second device region 200. As such, performance of logic devices, such as field effect transistors, that are formed in the second device region 200 is not impacted by formation of the contoured gate capping dielectric 157. The contoured gate capping dielectric 157 can provide enhanced retention for floating gate devices using the gate electrode 154 that is covered by the contoured gate capping dielectric 157, without adversely impacting performance of the logic devices.

The foregoing outlines features of several embodiments so that those skilled in the art may better understand the aspects of the present disclosure. Each embodiment described using the term "comprises" also inherently discloses additional embodiments in which the term "comprises" is replaced with "consists essentially of" or with the term "consists of," unless expressly disclosed otherwise herein. Whenever two or more elements are listed as alternatives in a same paragraph of in different paragraphs, a Markush group including a listing of the two or more elements is also impliedly disclosed. Whenever the auxiliary verb "can" is used in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising a first field effect transistor, wherein the first field effect transistor comprises:
   a first source region and a first drain region embedded in a first portion of a semiconductor substrate;
   a first gate dielectric overlying a first channel region located between the first source region and the first drain region;
   a first gate electrode overlying the first gate dielectric;
   a first dielectric gate liner laterally surrounding the first gate electrode;
   a first inner gate spacer laterally surrounding the first dielectric gate liner;
   a contoured gate capping dielectric comprising a vertically-extending portion that laterally surrounds the first inner gate spacer and a first horizontally-extending portion that overlies the first gate electrode;
   a first outer gate spacer laterally surrounding the contoured gate capping dielectric; and
   a first source extension region adjoined to the first source region and comprising a first topmost source extension surface segment that contacts a bottom surface of the first dielectric gate liner and further comprises a first recessed source extension surface segment that contacts a bottom surface segment of the contoured gate capping dielectric.

2. The semiconductor structure of claim 1, wherein the contoured gate capping dielectric comprises a second horizontally-extending portion that is adjoined to a bottom region of the vertically-extending portion and underlies the first outer gate spacer.

3. The semiconductor structure of claim 2, wherein the second horizontally-extending portion of the contoured gate dielectric contacts a topmost surface of the first source region and a topmost surface of the first drain region.

4. The semiconductor structure of claim 2, wherein the first field effect transistor comprises
   a first drain extension region adjoined to the first drain region,
   wherein the first source extension region contacts a bottom surface of the second horizontally-extending portion of the contoured gate capping dielectric.

5. The semiconductor structure of claim 4, wherein the first source extension region comprises a first vertically-extending surface segment that connects the first topmost source extension surface segment and the first recessed source extension surface segment, and is in contact with a vertical surface segment of the second horizontally-extending portion of the contoured gate capping dielectric.

6. The semiconductor structure of claim 2, wherein:
   the second horizontally-extending portion of the contoured gate capping dielectric has a first thickness; and
   the first horizontally-extending portion of the contoured gate capping dielectric has a second thickness that is in a range from 40% to 90% of the first thickness.

7. The semiconductor structure of claim 6, wherein a lateral thickness of the vertically-extending portion of the contoured gate capping dielectric is the first thickness.

8. The semiconductor structure of claim 1, wherein each surface segment of the first inner gate spacer is in contact with a respective surface segment of a combination of the first dielectric gate liner and the contoured capping gate dielectric.

9. The semiconductor structure of claim 1, wherein:

the first dielectric gate liner comprises a first silicon oxide material;

the first inner gate spacer comprises a first silicon nitride material;

the contoured gate capping dielectric comprises a second silicon oxide material; and the first outer gate spacer comprises a second silicon nitride material.

10. The semiconductor structure of claim 1, further comprising a second field effect transistor that comprises:

a second source region and a second drain region embedded in a second portion of the semiconductor substrate;

a second gate dielectric overlying a second channel region located between the second source region and the second drain region;

a second gate electrode overlying the second gate dielectric;

a second dielectric gate liner laterally surrounding the second gate electrode;

a second inner gate spacer laterally surrounding the second dielectric gate liner; and a second outer gate spacer laterally surrounding the second inner gate spacer, wherein the second outer gate spacer is in contact with the second inner gate spacer or is spaced from the second inner gate spacer by a native oxide layer having a thickness less than 1 nm.

11. The semiconductor structure of claim 10, wherein the vertically-extending portion of the contoured gate capping dielectric has a thickness in a range from 10 nm to 60 nm.

12. A semiconductor structure comprising:

a first field effect transistor;

a second field effect transistor, wherein the first field effect transistor comprises:

a first source region and a first drain region embedded in a first portion of a semiconductor substrate;

a first gate dielectric and a first gate electrode;

a first dielectric gate liner laterally surrounding the first gate electrode;

a first inner gate spacer laterally surrounding the first dielectric gate liner;

a contoured gate capping dielectric comprising a vertically-extending portion that laterally surrounds the first inner gate spacer and a first horizontally-extending portion that overlies the first gate electrode; and a first outer gate spacer laterally surrounding the contoured gate capping dielectric, and wherein the second field effect transistor comprises:

a second source region and a second drain region embedded in a second portion of the semiconductor substrate;

a second gate dielectric and a second gate electrode;

a second dielectric gate liner laterally surrounding the second gate electrode and having a same material composition as the first dielectric gate liner;

a second inner gate spacer laterally surrounding the second dielectric gate liner and having a same material composition as the first inner gate spacer; and a second outer gate spacer laterally surrounding the second inner gate spacer and having a same material composition as the first outer gate spacer, wherein the second outer gate spacer is in contact with the second inner gate spacer or is spaced from the second inner gate spacer by a native oxide layer having a thickness less than 1 nm; and a contact-level dielectric layer in contact with a surface segment of the contoured gate capping dielectric over the first gate electrode and in contact with surface segments of the first outer gate spacer outside an area of the first gate electrode.

13. The semiconductor structure of claim 12, wherein the contoured gate capping dielectric comprises a second horizontally-extending portion that is adjoined to a bottom region of the vertically-extending portion and underlies the first outer gate spacer.

14. The semiconductor structure of claim 13, wherein:

the second horizontally-extending portion of the contoured gate capping dielectric has a first thickness; and the first horizontally-extending portion of the contoured gate capping dielectric has a second thickness that is in a range from 40% to 90% of the first thickness.

15. The semiconductor structure of claim 12, further comprising a first gate contact via structure contacting a top surface of the second gate electrode, wherein all surface segments of the first gate electrode is in contact with a respective surface segment of a combination of the first gate dielectric, the first dielectric gate liner, and the first horizontally-extending portion of the contoured gate capping dielectric.

16. A method of forming a semiconductor structure, the method comprising:

forming a first gate dielectric and a first gate electrode over a first portion of a semiconductor substrate;

forming a combination of a first dielectric gate liner and a first inner gate spacer around the first gate electrode;

forming a combination of a contoured gate capping dielectric and a first outer gate spacer, wherein the contoured gate capping dielectric comprises a vertically-extending portion that laterally surrounds the first inner gate spacer and a first horizontally-extending portion that overlies the first gate electrode, and the first outer gate spacer laterally surrounds the contoured gate capping dielectric;

forming a first source region and a first drain region in the first portion of the semiconductor substrate adjacent to the combination of the contoured gate capping dielectric and the first outer gate spacer; and forming a contact-level dielectric layer on a surface segment of the contoured gate capping dielectric over the first gate electrode and on the first outer gate spacer outside an area of the first gate electrode.

17. The method of claim 16, further comprising:

forming a capping dielectric material layer over the combination of the first dielectric gate liner and the first inner gate spacer;

forming an outer spacer material layer over a first portion the capping dielectric material layer; and anisotropically etching the outer spacer material layer and the first portion of the capping dielectric material layer, wherein the contoured gate capping dielectric comprises a patterned portion of the capping dielectric material layer, and the first outer gate spacer comprises a patterned portion of the outer spacer material layer.

18. The method of claim 17, wherein:

the contoured gate capping dielectric comprises a second horizontally-extending portion that underlies the first outer gate spacer and a third horizontally-extending portion that does not underlie the first outer gate spacer;

the first source region and the first drain region are formed by implantation of atoms of a dopant species through the third horizontally-extending portion of the contoured gate capping dielectric; and the method comprises removing the third horizontally-extending portion of the contoured gate capping dielectric after formation of the source region and the drain region.

19. The method of claim 17, further comprising:

forming a second gate dielectric and a second gate electrode over a second portion of the semiconductor substrate;

forming a combination of a second dielectric gate liner and a second inner gate spacer around the second gate electrode;

removing a second portion of the capping dielectric material layer overlying the second portion of the semiconductor substrate without removing the first portion of the capping dielectric material layer.

20. The method of claim 16, further comprising:

conformally depositing a dielectric liner material layer and an inner spacer material layer over the first gate electrode; and anisotropically etching the inner spacer material layer and the dielectric liner material layer, wherein the first dielectric gate liner comprises a remaining portion of the dielectric liner material layer, and the first inner gate spacer comprises a remaining portion of the inner spacer material layer.

* * * * *